United States Patent
Kum et al.

(10) Patent No.: US 10,115,924 B2
(45) Date of Patent: Oct. 30, 2018

(54) ORGANIC LIGHT EMITTING DISPLAY APPARATUS

(71) Applicant: LG Display Co., Ltd., Seoul (KR)

(72) Inventors: Taell Kum, Paju-si (KR); Ki-Woog Song, Goyang-si (KR); SoYeon Ahn, Seoul (KR); Yongjoong Choi, Seoul (KR); Mingyu Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/221,434

(22) Filed: Jul. 27, 2016

(65) Prior Publication Data

US 2017/0084856 A1    Mar. 23, 2017

(30) Foreign Application Priority Data

Sep. 18, 2015 (KR) .......................... 10-2015-0132531

(51) Int. Cl.
H01L 29/08 (2006.01)
H01L 35/24 (2006.01)
H01L 51/00 (2006.01)
H01L 51/50 (2006.01)
H01L 51/52 (2006.01)

(52) U.S. Cl.
CPC ........ H01L 51/504 (2013.01); H01L 51/5218 (2013.01); H01L 51/5234 (2013.01); H01L 51/5265 (2013.01); H01L 51/5278 (2013.01); H01L 2251/5315 (2013.01); H01L 2251/558 (2013.01)

(58) Field of Classification Search
CPC ........... H01L 51/5278; H01L 2251/558; H01L 51/5044; H01L 27/3209; H01L 51/504; H01L 51/5218; H01L 51/5234; H01L 51/5265; H01L 2251/5315; H01L 2251/555
USPC ................ 257/40; 438/35, 46; 313/504, 506
See application file for complete search history.

(56) References Cited

U.S. PATENT DOCUMENTS

| | | | |
|---|---|---|---|
| 2010/0187552 A1* | 7/2010 | Lee ..................... | H05B 33/10 257/98 |
| 2012/0205685 A1* | 8/2012 | Seo ..................... | H01L 51/5044 257/89 |
| 2012/0248971 A1* | 10/2012 | Okuyama ............. | C09K 11/06 313/504 |
| 2013/0285039 A1 | 10/2013 | Ishihara | |
| 2013/0320837 A1* | 12/2013 | Weaver ................ | H05B 33/14 313/504 |
| 2014/0183494 A1* | 7/2014 | Kam .................... | H01L 51/5088 257/40 |
| 2015/0155513 A1* | 6/2015 | Pieh .................... | H01L 27/3209 257/40 |

(Continued)

*Primary Examiner* — Thao X Le
*Assistant Examiner* — Nduka Ojeh
(74) *Attorney, Agent, or Firm* — Fenwick & West LLP

(57) ABSTRACT

An OLED apparatus that may include a reflection-anode, a transparent-cathode, and a plurality of stacks between the reflection-anode and the transparent-cathode, wherein, among the plurality of stacks, a thickness of the stack disposed relatively close to the transparent-cathode is larger than a thickness of the stack disposed relatively close to the reflection-anode so that it is possible to optimize a microcavity of light emitted from the plurality of stacks, thereby improving a light-emission efficiency and a color reproduction ratio and reducing a color change rate in accordance with a viewing angle.

5 Claims, 7 Drawing Sheets

(56) References Cited

U.S. PATENT DOCUMENTS

2015/0155519 A1    6/2015  Lee
2015/0188073 A1*  7/2015  Ahn .................... H01L 27/3209
                                                                   257/40
2016/0181561 A1*  6/2016  Lee ..................... H01L 51/5278
                                                                   257/40
2017/0125714 A1*  5/2017  Jung .................... H01L 51/504

* cited by examiner

|  |  | First embodiment (Embodiment 1) | Comparative example 1 | Comparative example 2 | Comparative example 3 |
|---|---|---|---|---|---|
| Light-emission efficiency | R | 100% | 51% | 20% | 20% |
|  | G | 100% | 9% | 22% | 26% |
|  | B | 100% | 71% | 63% | 95% |
|  | W | 100% | 17% | 20% | 25% |

| | | Second embodiment (Embodiment 2) | Comparative example 4 | Comparative example 5 |
|---|---|---|---|---|
| Light-emission efficiency | R | 100% | 24% | 45% |
| | G | 100% | 8% | 87% |
| | B | 100% | 88% | 99% |
| | W | 100% | 14% | 78% |

ORGANIC LIGHT EMITTING DISPLAY APPARATUS

CROSS REFERENCE TO RELATED APPLICATIONS

This application claims the benefit of Korean Patent Application No. 10-2015-0132531, filed on Sep. 18, 2015, which is hereby incorporated by reference as if fully set forth herein.

BACKGROUND

Field of the Disclosure

Embodiments of the present disclosure relate to an organic light emitting display apparatus (OLED apparatus), and more particularly, to a top emission type organic light emitting display apparatus (OLED apparatus) which is capable of realizing high emission efficiency, good color reproduction ratio, and improved color change rate by optimizing a thickness ratio in a plurality of stacks between two electrodes.

Discussion of the Related Art

An organic light emitting display apparatus (OLED apparatus) is a next generation display apparatus having self-luminance properties. In more detail, the OLED apparatus is a display apparatus capable of displaying an image by producing excitons through a recombination of holes and electrons, which are injected from an anode and cathode, in a light emitting layer, and generating light with a specific wavelength by an energy emission of the produced excitons.

Unlike a liquid crystal display apparatus (LCD apparatus), the OLED apparatus does not require an additional light source. Thus, the OLED apparatus has a light weight and thin profile. In comparison to the LCD apparatus, the OLED apparatus has various advantages of a wide viewing angle, good contrast ratio, rapid response time and low power consumption, and the OLED apparatus has attracted attention as the next generation display apparatus.

SUMMARY

According to an embodiment, an OLED apparatus may have a patterned emission layer structure or a common emission layer structure.

In case of the OLED apparatus having the patterned emission layer structure, emission layers for emitting different colored light, for example, red, blue, and green emission layers are disposed between two electrodes, and are separately provided every pixel, wherein different monochromatic light is emitted from each pixel. The separated emission layers may be patterned and deposited by the use of a fine patterning mask whose opening is provided every pixel, for example, a fine metal mask (FMM).

In case of the OLED apparatus having the common emission layer structure, a plurality of stacks for emitting white light are provided between two electrodes. Also, the plurality of stacks are connected or extended from one pixel to the neighboring pixel without disconnection, whereby the plurality of pixels are shared and white light is emitted from all pixels.

The OLED apparatus having the common emission layer structure may be formed by the use of common mask with open areas corresponding to all pixels, whereby all pixels may be formed in the same structure. Thus, in case of the OLED apparatus having the common emission layer structure, it is more appropriate for a large-sized product, in comparison to the OLED apparatus having the patterned emission layer structure. Also, the OLED apparatus having the common emission layer structure enables a simplified process, to thereby improve manufacturing yield.

In the OLED apparatus having the common emission layer structure, each of the plurality of stacks includes at least one emission layer. In this case, light emitted from each emission layer of each stack is mixed together, and white light is emitted through any one of the two electrodes. At this time, a micro-cavity of the light emitted from the emission layer disposed between the two electrodes may be optimized by a position or thickness of each of the plurality of stacks disposed between the two electrodes. Herein, the micro-cavity indicates that light-emission efficiency is improved by amplification and constructive interference of the light with a specific wavelength through repetitive reflection and re-reflection of the light emitted from the emission layer between the two electrodes.

Meanwhile, according to a direction of light, the OLED apparatus may be generally classified into a top emission type and a bottom emission type. In case of the bottom emission type, light emitted from the emission layer passes through the anode among the two electrodes, that is, light is emitted through a lower substrate with a thin film transistor. In case of the top emission type, light emitted from the emission layer passes through the cathode of the two electrodes, that is, light is emitted in an opposite direction to the lower substrate with the thin film transistor.

A structure of the two electrodes, that is, the anode and cathode in the OLED apparatus may be changed in accordance with the direction of light. In case of the top emission type OLED apparatus, light emitted from the emission layer is emitted to an upper direction through the cathode, whereby the anode has a structure with the reflection properties so as to prevent a light leakage in a lower direction, and the cathode has a structure with the transparent properties for a smooth light transmission. Meanwhile, in case of the bottom emission type OLED apparatus, light emitted from the emission layer is emitted to a lower direction through the anode, whereby the anode has a structure with the transparent properties for a smooth light transmission, and the cathode has a structure with the reflection properties so as to prevent a light leakage in an upper direction.

The aforementioned micro-cavity, which might occur between the two electrodes, may be influenced by the structure of each of the two electrodes as well as the position or thickness of each of the plurality of stacks disposed between the two electrodes. That is, the position of electrode with the reflection properties is changed in accordance with the light emission type of the OLED apparatus. Thus, in order to optimize the micro-cavity between the two electrodes, the position or thickness of each of the plurality of stacks disposed between the two electrodes has to be changed in accordance with the position of electrode with the reflection properties.

Inventors of the present disclosure propose a top emission type OLED apparatus which is capable of realizing improved emission efficiency and color reproduction ratio, and reducing a color change rate by optimizing a thickness of each of a plurality of stacks disposed between two electrodes through various experiments.

To achieve these and other advantages and in accordance with the purpose of embodiments of the disclosure, as embodied and broadly described herein, there is provided a top emission type OLED apparatus which is capable of realizing improved emission efficiency and color reproduction ratio, and reducing a color change rate by optimizing a thickness in each of the plurality of stacks disposed between the two electrodes, or a thickness ratio in the plurality of stacks disposed between the two electrodes.

It is to be understood that both the foregoing general description and the following detailed description of embodiments of the present disclosure are exemplary and explanatory and are intended to provide further explanation of the disclosure as claimed.

According to one embodiment of the present disclosure, an OLED apparatus may comprise a reflection-anode; a transparent-cathode; and a plurality of stacks disposed between the reflection-anode and the transparent-cathode, wherein, among the plurality of stacks, a thickness of the stack disposed relatively close to the transparent-cathode is larger than a thickness of the stack disposed relatively close to the reflection-anode. Accordingly, it is possible to optimize a micro-cavity of light emitted from the plurality of stacks, thereby improving light-emission efficiency and a color reproduction ratio and reducing a color change rate in accordance with a viewing angle.

In the OLED apparatus according to one embodiment of the present disclosure, the plurality of stacks include a first stack disposed on the reflection-anode; a first charge generation layer disposed on the first stack, wherein the first charge generation layer includes a first N-type charge generation layer, and a first P-type charge generation layer; a second stack disposed on the first charge generation layer; a second charge generation layer disposed on the second stack, wherein the second charge generation layer includes a second N-type charge generation layer, and a second P-type charge generation layer; and a third stack disposed on the second charge generation layer, wherein, when 'T1' indicates a distance from an upper surface of the reflection-anode to the interface between the first N-type charge generation layer and the first P-type charge generation layer, 'T2' indicates a distance from the interface between the first N-type charge generation layer and the first P-type charge generation layer to the interface between the second N-type charge generation layer and the second P-type charge generation layer, and 'T3' indicates a distance from the interface between the second N-type charge generation layer and the second P-type charge generation layer to an upper surface of the transparent-cathode, the above 'T1', 'T2', and 'T3' satisfy the following Equation 1, $$T3>T2>T1 \quad \text{[Equation 1]}$$

In the OLED apparatus according to one embodiment of the present disclosure, assuming that the total thickness of T1, T2, and T3 is 100%, T1 is within a range from 10% to 20%, T2 is within a range from 30% to 40%, and T3 is within a range from 45% to 60%.

In the OLED apparatus according to one embodiment of the present disclosure, each of the first stack and the third stack includes at least one organic layer having light-emitting dopant for emitting blue light, and the second stack includes at least one organic layer having light-emitting dopant for emitting yellow-green light.

In the OLED apparatus according to one embodiment of the present disclosure, each of the second stack and the third stack includes at least one organic layer having light-emitting dopant for emitting blue light, and the first stack includes at least one organic layer having light-emitting dopant for emitting yellow-green light.

According to another embodiment of the present disclosure, an OLED apparatus may comprise a reflection-anode, a transparent-cathode, and a plurality of stacks disposed between the reflection-anode and the transparent-cathode, wherein light is emitted from the plurality of stacks, and is emitted through the transparent-cathode, wherein a thickness ratio in the plurality of stacks is adjusted so as to obtain a color reproduction ratio of 99% or more than 99% and simultaneously to obtain Δu'v' value of 0.05 or less than 0.05 within a range of a viewing angle from 0° to 60°. Accordingly, it is possible to improve light-emission efficiency and a color reproduction ratio, and to reduce a color change ratio in accordance with a viewing angle.

In the OLED apparatus according to another embodiment of the present disclosure, the plurality of stacks include a first stack; and a second stack disposed between the first stack and the transparent-cathode, wherein a thickness of the second stack is larger than a thickness of the first stack.

In the OLED apparatus according to another embodiment of the present disclosure, the plurality of stacks further include an N-type charge generation layer and a P-type charge generation layer between the first stack and the second stack, a thickness of the first stack is a distance from an upper surface of the reflection-anode to the interface between the N-type charge generation layer and the P-type charge generation layer, and a thickness of the second stack is a distance from the interface between the N-type charge generation layer and the P-type charge generation layer to an upper surface of the transparent-cathode.

In the OLED apparatus according to another embodiment of the present disclosure, assuming that the total thickness of the first stack and the second stack is 100%, the thickness of the first stack is within a range from 15% to 35%, and the thickness of the second stack is within a range from 65% to 85%.

In the OLED apparatus according to another embodiment of the present disclosure, the first stack includes at least one organic layer having light-emitting dopant for emitting blue light, and the second stack includes at least one organic layer having light-emitting dopant for emitting yellow-green light.

In the OLED apparatus according to another embodiment of the present disclosure, the plurality of stacks include a first stack disposed closest to the reflection-anode; a third stack disposed closest to the transparent-cathode; and a second stack disposed between the first stack and the third stack, wherein a thickness of the third stack is larger than a thickness of the first stack and a thickness of the second stack, and the thickness of the second stack is larger than the thickness of the first stack.

In the OLED apparatus according to another embodiment of the present disclosure, the plurality of stacks further include a first charge generation layer disposed between the first stack and the second stack, wherein the first charge generation layer includes a first N-type charge generation layer and a first P-type charge generation layer; and a second charge generation layer disposed between the second stack and the third stack, wherein the second charge generation layer includes a second N-type charge generation layer and a second P-type charge generation layer, wherein a thickness of the first stack corresponds to a distance from an upper surface of the reflection-anode to the interface between the first N-type charge generation layer and the first P-type charge generation layer, a thickness of the second stack corresponds to a distance from the interface between the first N-type charge generation layer and the first P-type charge generation layer to the interface between the second N-type charge generation layer and the second P-type charge generation layer, and a thickness of the third stack corresponds to a distance from the interface between the second N-type charge generation layer and the second P-type charge generation layer to an upper surface of the transparent-cathode.

In the OLED apparatus according to another embodiment of the present disclosure, assuming that the total thickness of the thickness of the first stack, the thickness of the second stack, and the thickness of the third stack is 100%, the thickness of the first stack is within a range from 10% to 20%, the thickness of the second stack is within a range from 30% to 40%, and the thickness of the third stack is within a range from 45% to 60%.

In the OLED apparatus according to another embodiment of the present disclosure, each of the first stack and the third stack includes at least one organic layer having light-emitting dopant for emitting blue light, and the second stack includes at least one organic layer having light-emitting dopant for emitting yellow-green light.

In the OLED apparatus according to another embodiment of the present disclosure, each of the second stack and the third stack includes at least one organic layer having light-emitting dopant for emitting blue light, and the first stack includes at least one organic layer having light-emitting dopant for emitting yellow-green light.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION OF THE EMBODIMENTS

Figure 1:
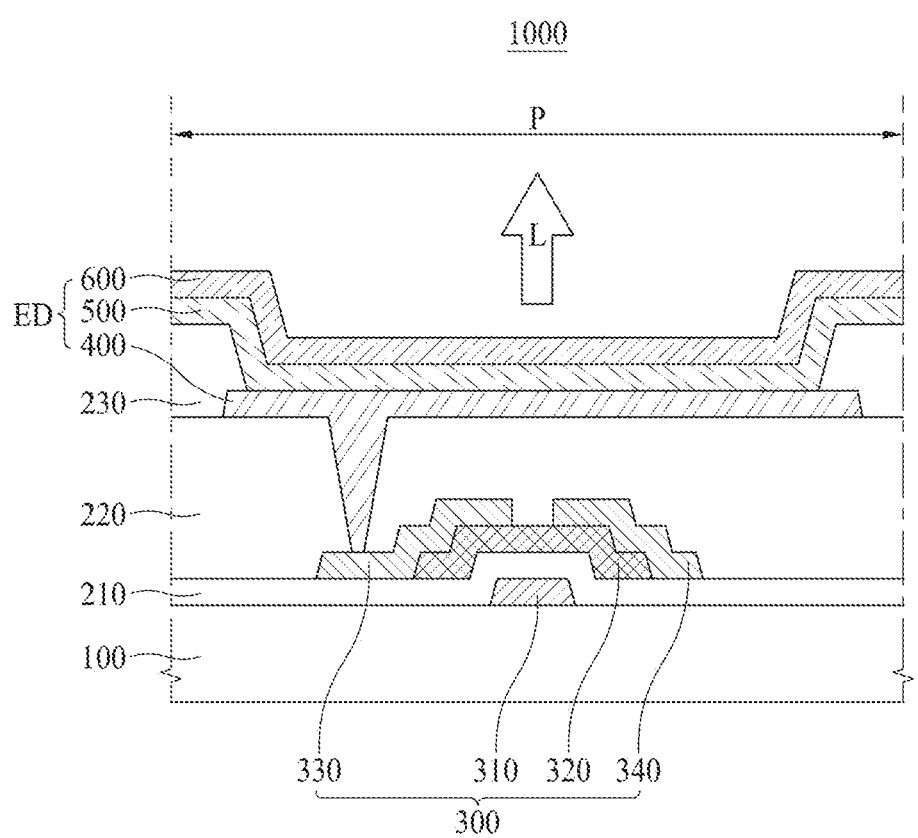
FIG. 1 is a cross sectional view illustrating an OLED apparatus according to the first embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts. Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a single form may include plural forms unless referred to the contrary.

In construing an element, the element is construed as including an error range although there is no explicit description.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

For convenience of explanation, a size and thickness of each element may show as exemplary in the drawings, but not limited to the shown size and thickness.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display apparatus (OLED apparatus) according to embodiments of the present disclosure will be described in detail with reference to the accompanying drawings.

FIG. 1 is a cross sectional view illustrating an OLED apparatus 1000 according to one embodiment of the present disclosure.

Referring to FIG. 1, the OLED apparatus 1000 may include a substrate 100, a thin film transistor 300, and a light-emitting device (ED).

The OLED apparatus 1000 may include a plurality of pixels (P). The pixel (P) indicates a minimum unit for emitting light, which can also be referred to as a sub-pixel or a pixel region. Also, the plurality of pixels (P) may constitute one group for expressing white light. For example, three pixels (sub-pixels) including a red pixel (sub-pixel), a green pixel (sub-pixel), and a blue pixel (sub-pixel) may constitute one group, or four pixels (sub-pixels) including a red pixel (sub-pixel), a green pixel (sub-pixel), a blue pixel (sub-pixel), and a white pixel (sub-pixel) may constitute one group. However, it is not limited to this structure, that is, various pixel or sub-pixel designs are possible. For convenience of explanation, FIG. 1 shows only one pixel (P).

The thin film transistor 300 is disposed on the substrate 100, and the thin film transistor 300 supplies various signals to the light-emitting device (ED). The thin film transistor 300 shown in FIG. 1 may be a driving thin film transistor connected with an anode 400 of the light-emitting device (ED). A switching thin film transistor or a capacitor for driving the light-emitting device (ED) may be additionally disposed on the substrate 100.

The substrate 100 is formed of an insulating material. For example, the substrate 100 may be formed of a glass, or a flexible film of a polyimide-based material.

The thin film transistor 300 may include a gate electrode 310, an active layer 320, a source electrode 330, and a drain electrode 340. Referring to FIG. 1, the gate electrode 310 is disposed on the substrate 100, and a gate insulating layer 210 covers the gate electrode 310. Also, the active layer 320 is disposed on the gate insulating layer 210, and is overlapped with the gate electrode 310. The source electrode 330 and the drain electrode 340 are disposed on the active layer 320, and the source electrode 330 and the drain electrode 340 are spaced apart from each other.

In description of embodiments of the present disclosure, if two elements are overlapped with each other, the two elements may be at least partially overlapped with each other regardless of another element interposed in-between, and they may be referred to as various names.

The gate electrode 310, the source electrode 330, and the drain electrode 340 are formed of a conductive material, for example, molybdenum (Mo), aluminum (Al), chrome (Cr), gold (Au), titanium (Ti), nickel (Ni), neodymium (Nd), cupper (Cu), and their alloys, but is not limited to these materials.

The active layer 320 may be formed of any one among amorphous silicon (a-Si), polycrystalline silicon (poly-Si), oxide, and organic materials, but is not limited to these materials.

The gate insulating layer 210 may be formed in a single layer structure or multi-layered structure of inorganic material, for example, silicon oxide (SiOx), silicon nitride (SiNx), and etc.

FIG. 1 shows the thin film transistor 300 having a staggered structure, but is not limited to this structure. The thin film transistor 300 may have a coplanar structure instead of the staggered structure.

Then, a planarization layer 220 for exposing a predetermined portion of the source electrode 330 is disposed on the thin film transistor 300. The planarization layer 220 may have a single layered structure or multi-layered structure, and the planarization layer 220 may be formed of an organic material. For example, the planarization layer 220 may be formed of polyimide, acryl, and etc.

A passivation layer may be additionally provided between the planarization layer 220 and the thin film transistor 300. The passivation layer is formed of an inorganic material. The passivation layer protects the thin film transistor 300. Like the planarization layer 220, the passivation layer may expose a predetermined portion of the source electrode 330.

The light-emitting device (ED) is disposed on the planarization layer 220, and the light-emitting device (ED) includes an anode 400, a light-emitting unit 500, and a cathode 600. The anode 400 of the light-emitting device (ED) is connected with the source electrode 330 of the thin film transistor 300, and various signals are supplied to the anode 400 of the light-emitting device (ED) through the thin film transistor 300. The anode 400 may be connected with the drain electrode 340 of the thin film transistor 300 according to the kind of the thin film transistor 300 According to the kind of the thin film transistor 300.

The OLED apparatus 1000 of FIG. 1 is a top emission type, wherein light (L) emitted from the light-emitting unit 500 may emit to an upper direction through the cathode 600. In case of the OLED apparatus 1000 of the top emission type, the light (L) emitted from the light-emitting unit 500 does not emit to a lower direction (or a direction passing through the substrate 100), so that it is possible to provide the thin film transistor 300 disposed between the light-emitting device (ED) and the substrate 100, and overlapped with the light-emitting device (ED). Accordingly, an aperture ratio of the top emission type OLED apparatus 1000 may be improved in comparison to an aperture ratio of a bottom emission type OLED apparatus so that it facilitates a high resolution in the OLED apparatus 1000.

A bank 230 is provided to divide the pixel (P), and the bank 230 covers an end of the anode 400. Referring to FIG. 1, the bank 230 exposes a predetermined portion of an upper surface of the anode 400. The bank 230 may be formed of an organic material, for example, any one among polyimide and photoacryl, but is not limited to these materials.

If white light (L) is emitted from the light-emitting unit 500 of the OLED apparatus 1000, the white light (L) emitted from the light-emitting unit 500 passes through a color filter disposed by each pixel (P), and it results in a corresponding pixel (P). For example, if the white light (L) emitted from the light-emitting unit 500 passes through a red color filter, it results in emissions from a red pixel. If the white light (L) emitted from the light-emitting unit 500 passes through a blue color filter, it results in emissions from a blue pixel. If the white light (L) emitted from the light-emitting unit 500 passes through a green filter, it results in emissions from a green pixel.

Figure 2:
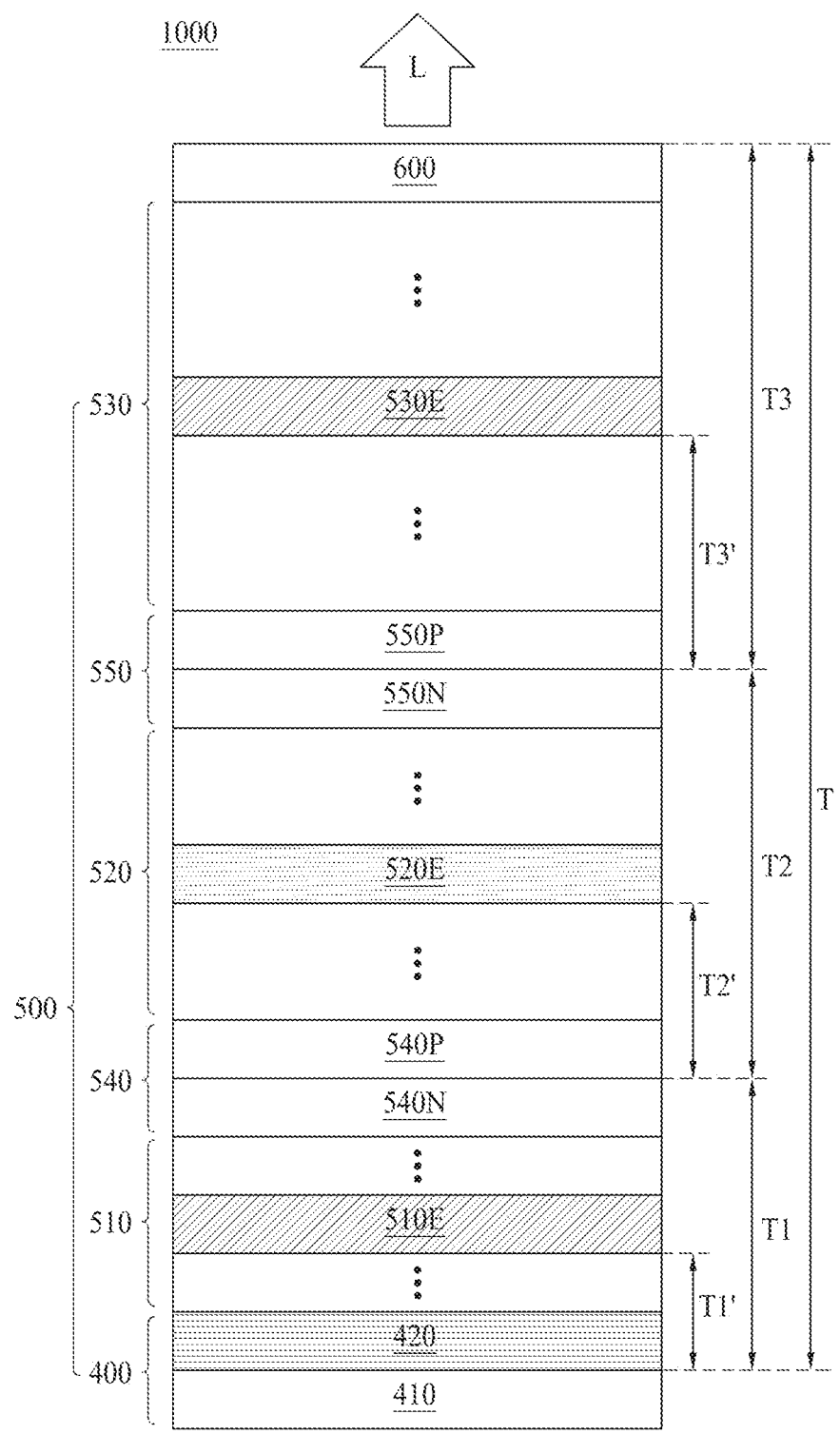
FIG. 2 is a cross sectional view illustrating main components of the OLED apparatus according to the first embodiment of the present disclosure.

FIG. 2 is a cross sectional view illustrating main components of the OLED apparatus 1000 according to one embodiment of the present disclosure, which is a cross sectional view for explaining a stack structure of the plurality of light-emitting devices (ED) of the OLED apparatus 1000 shown in FIG. 1.

Referring to FIG. 2, each of the plurality of light-emitting devices (ED) included in the OLED apparatus 1000 includes the anode 400, the cathode 600, and the light-emitting unit 500 disposed between the anode 400 and the cathode 600. The light-emitting unit 500 indicates all layers disposed between the anode 400 and the cathode 600, or a stacked structure of all layers disposed between the anode 400 and the cathode 600.

The light-emitting unit 500 of the OLED apparatus 1000 according to the first embodiment of the present disclosure includes a plurality of stacks, and a plurality of charge generation layers 540 and 550. In detail, as shown in FIG. 2, the light-emitting unit 500 may be formed in a sequential stacked structure of a first stack 510 including a first emission layer 510E, a first charge generation layer 540 including a first N-type charge generation layer 540N and a first P-type charge generation layer 540P, a second stack 520 including a second emission layer 520E, a second charge generation layer 550 including a second N-type charge generation layer 550N and a second P-type charge generation layer 550P, and a third stack 530 including a third emission layer 530E.

The light-emitting unit 500 of the OLED apparatus 1000 according to one embodiment of the present disclosure shown in FIG. 2 has a common emission layer structure, wherein the light-emitting unit 500 emits the white light (L). The light-emitting unit 500 with the common emission layer structure may be formed by the use of a common mask with open areas corresponding to all pixels (P). The light-emitting unit 500 may be deposited in the same structure for all pixels (P) without an individual pattern every pixel (P). That is, the light-emitting unit 500 is connected or disposed without disconnection from one pixel (P) to the neighboring pixel (P) so that the light-emitting unit 500 is shared by the plurality of pixels (P). Also, the respective light emitted from the plurality of stacks 510, 520, and 530 of the light-emitting unit 500 may be mixed together, whereby the white light (L) may be emitted through the cathode 600.

The anode 400 is separately disposed in each pixel (P). The anode 400 is an electrode for supplying or transmitting a hole to the light-emitting unit 500, and the anode 400 is connected with the source or drain electrode of the thin film transistor.

The anode 400 is configured to have a structure with reflective properties for smoothly reflecting the light (L) emitted from the light-emitting unit 500 to an upper direction (or a direction passing through the cathode 600).

For example, as shown in FIG. 2, the anode 400 may be formed in a dual-layered structure of a reflection layer 410 and a transparent layer 420. The transparent layer 420 supplies or transmits the holes to the light-emitting unit 500, and the reflection layer 410 reflects the light (L) emitted from the light-emitting unit 500, wherein the reflection layer 410 is disposed under the transparent layer 420. In this case, the reflection layer 410 may be referred to as a reflection-anode. The transparent layer 420 may be formed of TCO (transparent conductive oxide) material such as ITO (indium tin oxide) or IZO (indium zinc oxide), and the reflection layer 410 may be formed of a metal material such as copper (Cu), silver (Ag), and palladium (Pd).

The anode 400 may be formed of a single layered structure or three-layered structure of a material(s) or structure(s) having the properties for supplying or transmitting the holes to the light-emitting unit 500 and reflecting the light (L) emitted from the light-emitting unit 500. For example, the anode 400 may be formed in a three-layered structure including a transparent layer, a reflection layer, and another transparent layer deposited in sequence. In this case, the reflection layer disposed between the two transparent layers may be referred to as a reflection-anode. Also, if the anode 400 is formed of the single layered structure having the reflection properties, the single anode 400 may be referred to as a reflection-anode.

The cathode 600 is disposed on the light-emitting unit 500, wherein the cathode 600 is an electrode for supplying or transmitting electrons to the light-emitting unit 500. The cathode 600 may have transparent properties to pass the light (L) emitted from the light-emitting unit 500 therethrough, and the cathode 600 may be formed in a single-layered structure or a multi-layered structure. The cathode 600 may be referred to as a transparent-cathode. The cathode 600 may be formed of a metal material layer having a small thickness, for example, silver (Ag), magnesium (Mg), silver-magnesium (Ag—Mg), and etc. Also, the cathode 600 may be formed of TCO (transparent conductive oxide) material such as ITO (indium tin oxide) or IZO (indium zinc oxide).

The light-emitting unit 500 disposed between the anode 400 and the cathode 600 includes the plurality of stacks 510, 520, and 530, and the first and second charge generation layers 540 and 550 disposed each of the stacks.

The first stack 510 is disposed on the anode 400. Among the plurality of stacks 510, 520, and 530, the first stack 510 is relatively close to the anode 400.

The first stack 510 may include at least one organic layer having light-emitting dopant for emitting blue light or yellow-green light. For example, as shown in FIG. 2, the first stack 510 may include the first emission layer 510E having light-emitting dopant for emitting blue light or yellow-green light.

The first emission layer 510E may be formed in a single-layered or multi-layered structure including the light-emitting dopant for emitting blue light or yellow-green light. In detail, the first emission layer 510E may include at least one host and at least one light-emitting dopant for emitting blue light or yellow-green light. The first emission layer 510E may include a mixed host having two hosts mixed together, and at least one light-emitting dopant for emitting blue light or yellow-green light. The mixed host may include a host having hole transporting properties, and a host having an electron transporting properties.

For example, the light-emitting dopant for emitting blue light may be formed of a pyrene-based compound replaced by an arylamine-based compound, but is not limited to this material.

For example, the light-emitting dopant for emitting yellow-green light may be formed of an iridium-based compound, but is not limited to this material.

The first stack 510 may further include at least one among a hole injecting layer (HIL), a hole transporting layer (HTL), an electron transporting layer (ETL), an electron injecting layer (EIL), a hole blocking layer (HBL), an electron blocking layer (EBL), and an auxiliary emission layer. The following description shall be based on each layer being distinct, at least one functionality can be implemented in another layer, such that certain layers may serve multi-functional purposes.

The hole injecting layer (HIL) enables a smooth injection of the hole from the anode 400. For example, the hole injecting layer (HIL) may be formed of MTDATA(4,4',4"-tris(3-methylphenylphenylamino)triphenylamine), CuPc (copper phthalocyanine), PEDOT/PSS(poly(3,4-ethylenedioxythiophene, polystyrene sulfonate), and etc., but is not limited to these materials.

The hole transporting layer (HTL) enables a smooth transfer of holes, which are supplied or transmitted from the anode 400, to the first emission layer 510E. For example, the hole transporting layer (HTL) may be formed of NPD(N,N'-bis(naphthalene-1-yl)-N,N'-bis(phenyl)-2,2'-dimethyl-benzidine), TPD(N,N'-bis-(3-methylphenyl)-N,N'-bis-(phenyl)-benzidine), Spiro-TAD(2,2'7,7'tetrakis(N,N-diphenylamino)-9,9'-spirofluorene), and etc., but is not limited to these materials.

The electron transporting layer (ETL) enables a smooth transfer of electrons, which are supplied or transmitted from the first charge generation layer 540 or the cathode 600, to the first emission layer 510E. For example, the electron transporting layer (ETL) may be formed of PBD(2-(4-biphenyl)-5-(4-tert-butylphenyl)-1,3,4-oxadiazole), TAZ(3-(4-biphenyl)-4-phenyl-5-tertbutylphenyl-1,2,4-triazole), Liq (8-hydroxyquinolinolato-lithium), BAlq(Bis(2-methyl-8-quinolinolate)-4-(phenylphenolato)aluminum), TPBi(2,2', 2'-(1,3,5-benzinetriyl)-tris(1-phenyl-1-H-benzimidazole), and etc., but is not limited to these materials.

The electron injecting layer (EIL) enables a smooth injection of electrons from the first charge generation layer 540 or the cathode 600.

The hole blocking layer (HBL) prevents the holes injected into the first emission layer 510E from being diffused and getting out of the first emission layer 510E. The electron transporting layer (ETL) and the hole blocking layer (HBL) may be formed as one layer.

The electron blocking layer (EBL) prevents the electron injected into the first emission layer 510E from being diffused and getting out of the first emission layer 510E. The hole transporting layer (HTL) and the electron blocking layer (EBL) may be formed as one layer.

The auxiliary emission layer of the first stack 510 may include light-emitting dopant for emitting light whose color is different from that of the light emitted from the first emission layer 510E.

For example, if the first emission layer 510E of the first stack 510 includes light-emitting dopant for emitting blue light, the auxiliary emission layer of the first stack 510 may include light-emitting dopant for emitting yellow-green light or red light. If the first emission layer 510E of the first stack 510 includes light-emitting dopant for emitting yellow-green light, the auxiliary emission layer of the first stack 510 may include light-emitting dopant for emitting green light or red light. Thus if the auxiliary emission layer is additionally provided in the first stack 510, it is possible to improve light-emission efficiency of red or green color.

If the first stack 510 includes the first emission layer 510E having the light-emitting dopant for emitting blue light, a peak wavelength of the light emitted from the first stack 510 may be within a range from 440 nm to 480 nm.

If the first stack 510 includes the first emission layer 510E having the light-emitting dopant for emitting blue light, and the auxiliary emission layer having the light-emitting dopant for emitting red light, a peak wavelength of the light emitted from the first stack 510 may be within a range from 440 nm to 650 nm. And, if the first stack 510 includes the first emission layer 510E having the light-emitting dopant for emitting blue light, and the auxiliary emission layer having the light-emitting dopant for emitting yellow-green light, a peak wavelength of the light emitted from the first stack 510 may be within a range from 440 nm to 590 nm.

If the first stack 510 includes the first emission layer 510E having the light-emitting dopant for emitting yellow-green light, a peak wavelength of the light emitted from the first stack 510 may be within a range from 540 nm to 580 nm If the first stack 510 includes the first emission layer 510E having the light-emitting dopant for emitting yellow-green light, and the auxiliary emission layer having the light-emitting dopant for emitting red light, a peak wavelength of the light emitted from the first stack 510 may be within a range from 540 nm to 650 nm. And, if the first stack 510 includes the first emission layer 510E having the light-emitting dopant for emitting yellow-green light, and the auxiliary emission layer having the light-emitting dopant for emitting green light, a peak wavelength of the light emitted from the first stack 510 may be within a range from 510 nm to 590 nm.

As described above, the first stack 510 further includes at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer, so that it is possible to improve light-emission efficiency or driving voltage properties of the OLED apparatus 1000. According to an embodiment of the OLED apparatus 1000, the additional organic layers may be selectively disposed in the first stack 510. Also, a thickness (T1) of the first stack 510 and a position of the first emission layer 510E in the first stack 510 may be adjusted based on the position, the thickness, or the number of the additional organic layers included in the first stack 510.

The first charge generation layer 540 is disposed on the first stack 510, or disposed between the first stack 510 and the second stack 520, to thereby adjust a charge balance between the first stack 510 and the second stack 520. The first charge generation layer 540 includes the first N-type charge generation layer 540N and the first P-type charge generation layer 540P.

The first N-type charge generation layer 540N is provided to inject electrons into the first stack 510. The first N-type charge generation layer 540N may be formed of a layer doped with alkali-based metal such as lithium (Li), natrium (Na), kalium (K) or cesium (Cs), or a layer doped with alkali earth metal such as magnesium (Mg), strontium (Sr), barium (Ba) or radium (Ra), but is not limited to these materials.

The first P-type charge generation layer 540P is provided to inject holes into the second stack 520. For example, the first P-type charge generation layer 540P may be formed of a layer including P-type dopant, but is not limited to this material.

The second stack 520 is disposed on the first charge generation layer 540.

The second stack 520 may include at least one organic layer having the light-emitting dopant for emitting yellow-green light or blue light. For example, as shown in FIG. 2, the second stack 520 may include the second emission layer 520E having the light-emitting dopant for emitting yellow-green light or blue light.

The second emission layer 520E may be formed in a single-layered structure or multi-layered structure having the light-emitting dopant for emitting yellow-green light or blue light. In detail, if the first emission layer 510E of the first stack 510 includes the light-emitting dopant for emitting blue light, the second emission layer 520E of the second stack 520 may include the light-emitting dopant for emitting yellow-green light. If the first emission layer 510E of the first stack 510 includes the light-emitting dopant for emitting yellow-green light, the second emission layer 520E of the second stack 520 may include the light-emitting dopant for emitting blue light.

The second emission layer 520E may include at least one host and at least one light-emitting dopant for emitting yellow-green light or blue light, or may include a mixed host including two hosts mixed together and at least one light-emitting dopant for emitting yellow-green light or blue light.

In the same manner as the first stack 510, the second stack 520 may include at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer.

The auxiliary emission layer of the second stack 520 may include light-emitting dopant for emitting light whose color is different from that of the light emitted from the second emission layer 520E. If the second emission layer 520E of the second stack 520 includes light-emitting dopant for emitting yellow-green light, the auxiliary emission layer of the second stack 520 may include light-emitting dopant for emitting green light or red light. If the second emission layer 520E of the second stack 520 includes light-emitting dopant for emitting blue light, the auxiliary emission layer of the second stack 520 may include light-emitting dopant for emitting yellow-green light or red light. According as the auxiliary emission layer is additionally provided in the second stack 520, it is possible to improve light-emission efficiency of red or green color.

If the second stack 520 includes the second emission layer 520E having the light-emitting dopant for emitting yellow-green light, a peak wavelength of the light emitted from the second stack 520 may be within a range from 540 nm to 580 nm.

If the second stack 520 includes the second emission layer 520E having the light-emitting dopant for emitting yellow-green light, and the auxiliary emission layer having the light-emitting dopant for emitting red light, a peak wavelength of the light emitted from the second stack 520 may be within a range from 540 nm to 650 nm. And, if the second stack 520 includes the second emission layer 520E having the light-emitting dopant for emitting yellow-green light, and the auxiliary emission layer having the light-emitting dopant for emitting green light, a peak wavelength of the light emitted from the second stack 520 may be within a range from 510 nm to 590 nm.

If the second stack 520 includes the second emission layer 520E having the light-emitting dopant for emitting blue light, a peak wavelength of the light emitted from the second stack 520 may be within a range from 440 nm to 480 nm.

If the second stack 520 includes the second emission layer 520E having the light-emitting dopant for emitting blue light, and the auxiliary emission layer having the light-emitting dopant for emitting red light, a peak wavelength of the light emitted from the second stack 520 may be within a range from 440 nm to 650 nm. And, if the second stack 520 includes the second emission layer 520E having the light-emitting dopant for emitting blue light, and the auxiliary emission layer having the light-emitting dopant for emitting green light, a peak wavelength of the light emitted from the second stack 520 may be within a range from 440 nm to 580 nm.

As described above, the second stack 520 further includes at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer, it is possible to improve light-emission efficiency or driving voltage properties of the OLED apparatus 1000. According to an embodiment of the OLED apparatus 1000, the additional organic layers may be selectively disposed in the second stack 520. Also, a thickness (T2) of the second stack 520 and a position of the second emission layer 520E in the second stack 520 may be adjusted based on the position, the thickness, or the number of the additional organic layers included in the second stack 520.

The second charge generation layer 550 is disposed on the second stack 520, or disposed between the second stack 520 and the third stack 530, to thereby adjust a charge balance between the second stack 520 and the third stack 530. The second charge generation layer 550 includes the second N-type charge generation layer 550N and the second P-type charge generation layer 550P.

The second N-type charge generation layer 550N is provided to inject electrons into the second stack 520. The second N-type charge generation layer 550N may be formed of a layer doped with alkali-based metal such as lithium (Li), natrium (Na), kalium (K) or cesium (Cs), or a layer doped with alkali earth metal such as magnesium (Mg), strontium (Sr), barium (Ba) or radium (Ra), but not limited to these materials. According to an embodiment, the second N-type charge generation layer 550N may be formed of the same material as that of the first N-type charge generation layer 540N.

The second P-type charge generation layer 550P is provided to inject holes into the third stack 530. For example, the second P-type charge generation layer 550P may be formed of a layer including P-type dopant, but not limited to this material. According to an embodiment, the second P-type charge generation layer 550P may be formed of the same material as that of the first P-type charge generation layer 540P.

The third stack 530 is disposed on the second charge generation layer 550. Among the plurality of stacks 510, 520 and 530, the third stack 530 is relatively close to the cathode 600.

The third stack 530 may include at least one organic layer having the light-emitting dopant for emitting blue light. For example, as shown in FIG. 2, the third stack 530 may include the third emission layer 530E having the light-emitting dopant for emitting blue light.

The third emission layer 530E may be formed in a single-layered structure or multi-layered structure having the light-emitting dopant for emitting blue light. In detail, the third emission layer 530E may include at least one host and at least one light-emitting dopant for emitting blue light, or the third emission layer 530E may include a mixed host having two hosts mixed together, and at least one light-emitting dopant for emitting blue light.

In the same manner as the first stack 510 or second stack 520, the third stack 530 may include at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer.

The auxiliary emission layer of the third stack 530 may include light-emitting dopant for emitting light whose color is different from that of the light emitted from the third emission layer 530E. In detail, the auxiliary emission layer of the third stack 530 includes light-emitting dopant for emitting yellow-green light or red light. Thus if the auxiliary emission layer is additionally provided in the third stack 530, it is possible to improve light-emission efficiency of red or green color.

If the third stack 530 includes the third emission layer 530E having the light-emitting dopant for emitting blue light, a peak wavelength of the light emitted from the third stack 530 may be within a range from 440 nm to 480 nm.

If the third stack 530 includes the third emission layer 530E having the light-emitting dopant for emitting blue light, and the auxiliary emission layer having the light-emitting dopant for emitting yellow-green light or red light, a peak wavelength of the light emitted from the third stack 530 may be within a range from 440 nm to 650 nm.

As described above, the third stack 530 further includes at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer, it is possible to improve light-emission efficiency or driving voltage properties of the OLED apparatus 1000. According to an embodiment of the OLED apparatus 1000, the additional organic layers may be selectively disposed in the third stack 530. Also, a thickness (T3) of the third stack 530 or a position of the third emission layer 530E in the third stack 530 may be adjusted based on the position, the thickness, or the number of the additional organic layers included in the third stack 530.

In the top emission type OLED apparatus 1000 according to the first embodiment of the present invention, the thickness (T1, T2, T3) of each of the plurality of stacks 510, 520 and 530 is adjusted so as to control the properties of the OLED apparatus 1000, for example, light-emission efficiency, color reproduction ratio, or color change rate. In detail, in order to improve the properties of the OLED apparatus 1000, the thickness (T1, T2, T3) of each of the plurality of stacks 510, 520 and 530 is determined by an optimal ratio based on a micro-cavity between the anode 400 having the reflection properties and the cathode 600 having the transparent properties. As described above, the micro-cavity indicates that the light-emission efficiency is improved by amplification and constructive interference of the light with the specific wavelength through repetitive reflection and re-reflection of the light emitted from the emission layer between the two electrodes 400 and 600.

If the thickness (T1, T2, T3) of each of the plurality of stacks 510, 520 and 530 is not provided at the optimal ratio, it is difficult to optimize the micro-cavity of the light emitted from the emission layers 510E, 520E and 530E included in the plurality of stacks 510, 520 and 530, which causes problems of low light-emission efficiency, deteriorated color reproduction ratio, and increased color change rate. That is, if each emission layer 510E, 520E and 530E is not provided at the corresponding position enabling the optimal micro-cavity between the two electrodes 400 and 600, it may deteriorate the properties of the OLED apparatus 1000. The first emission layer 510E is disposed at the position enabling the micro-cavity of the light emitted from the first emission layer 510E between the two electrodes 400 and 600, the second emission layer 520E is disposed at the position enabling the micro-cavity of the light emitted from the second emission layer 520E between the two electrodes 400 and 600, and the third emission layer 530E is disposed at the position enabling the micro-cavity of the light emitted from the third emission layer 530E between the two electrodes 400 and 600.

The inventors of the present disclosure have conceived a special OLED apparatus 1000 which facilitates to improve the properties of light-emission efficiency, color reproduction ratio and color change rate by adjusting the thickness of each of the plurality of stacks 510, 520 and 530 or the thickness ratio in the plurality of stacks 510, 520 and 530 so as to optimize the micro-cavity of the light emitted from each of the plurality of stacks 510, 520 and 530. This will be described in detail as follows.

In the first embodiment of the present disclosure, the thickness (T1) of the first stack 510, the thickness (T2) of the second stack 520, and the thickness (T3) of the third stack 530 may be expressed with respect to the distance of the micro-cavity between the two electrodes 400 and 600 of the OLED apparatus 1000. In the first embodiment of the present disclosure, the micro-cavity between the two electrodes 400 and 600 may occur between an upper surface of the reflection layer 410 of the anode 400 having reflective properties and an upper surface of the cathode 600 having the transparent properties. Thus, the thickness (T1, T2, T3) of each of the plurality of stacks 510, 520 and 530 may be expressed with respect to the distance (T) from the upper surface of the reflection layer 410 of the anode 400 to the upper surface of the cathode 600 having the transparent properties.

Referring to FIG. 2, the thickness (T1) of the first stack 510 indicates the distance from the upper surface of the reflection layer 410 of the anode 400 to the interface between the first N-type charge generation layer 540N of the first charge generation layer 540 and the first P-type charge generation layer 540P of the first charge generation layer 540. In detail, the thickness (T1) of the first stack 510 may be expressed by the thickness including the thickness of the first N-type charge generation layer 540N and the thickness of the transparent layer 420 of the anode 400, as well as the total thickness of the layers included in the first stack 510. As described above, the first stack 510 may further include the additional organic layers of the hole injecting layer (HIL), the hole transporting layer (HTL), the electron transporting layer (ETL), the electron injecting layer (EIL), the hole blocking layer (HBL), the electron blocking layer (EBL), or the auxiliary emission layer. In this case, with respect to the distance (T) enabling the occurrence of the micro-cavity between the two electrodes 400 and 600, the thickness (T1) of the first stack 510 may be adjusted by the thickness of the transparent layer 420 of the anode 400 and the thickness of the first N-type charge generation layer 540N as well as the position, the thickness or the number of the additional organic layers selectively included in the first stack 510. Accordingly, it is possible to determine the position of the first emission layer 510E of the first stack 510 between the two electrodes 400 and 600.

The thickness (T2) of the second stack 520 indicates the distance from the interface between the first N-type charge generation layer 540N of the first charge generation layer 540 and the first P-type charge generation layer 540P of the first charge generation layer 540 to the interface between the second N-type charge generation layer 550N of the second charge generation layer 550 and the second P-type charge generation layer 550P of the second charge generation layer 550. In detail, the thickness (T2) of the second stack 520 may be expressed by the thickness including the thickness of the first P-type charge generation layer 540P and the thickness of the second N-type charge generation layer 550N, as well as the total thickness of the layers included in the second stack 520. Also, the second stack 520 may further include the additional organic layers of the hole injecting layer (HIL), the hole transporting layer (HTL), the electron transporting layer (ETL), the electron injecting layer (EIL), the hole blocking layer (HBL), the electron blocking layer (EBL), or the auxiliary emission layer, selectively. In this case, with respect to the distance (T) enabling the occurrence of the micro-cavity between the two electrodes 400 and 600, the thickness (T2) of the second stack 520 may be adjusted by the thickness of the first P-type charge generation layer 540P and the thickness of the second N-type charge generation layer 550N as well as the position, the thickness or the number of the additional organic layers selectively included in the second stack 520. Accordingly, it is possible to determine the position of the second emission layer 520E of the second stack 520 between the two electrodes 400 and 600.

The thickness (T3) of the third stack 530 indicates the distance from the interface between the second N-type charge generation layer 550N of the second charge generation layer 550 and the second P-type charge generation layer 550P of the second charge generation layer 550 to the upper surface of the cathode 600 having the transparent properties. In detail, the thickness (T3) of the third stack 530 may be expressed by the thickness including the thickness of the second P-type charge generation layer 550P and the thickness of the cathode 600, as well as the total thickness of the layers included in the third stack 530. Also, in the same manner as the first stack 510 or second stack 520, the third stack 530 may further include the additional organic layers of the hole injecting layer (HIL), the hole transporting layer (HTL), the electron transporting layer (ETL), the electron injecting layer (EIL), the hole blocking layer (HBL), the electron blocking layer (EBL), or the auxiliary emission layer, selectively. In this case, with respect to the distance (T) enabling the occurrence of the micro-cavity between the two electrodes 400 and 600, the thickness (T3) of the third stack 530 may be adjusted by the thickness of the second P-type charge generation layer 550P and the thickness of the cathode 600 as well as the position, the thickness or the number of the additional organic layers selectively included in the third stack 530. Accordingly, it is possible to determine the position of the third emission layer 530E of the third stack 530 between the two electrodes 400 and 600.

In the first embodiment of the present disclosure, among the plurality of stacks 510, 520 and 530 disposed between the anode 400 having the reflection properties and the cathode 600 having the transparent properties, according as the stack becomes close to the cathode 600, its thickness becomes larger in comparison to the thickness of the stack disposed to the anode 400. In more detail, referring to FIG. 2, among the plurality of stacks 510, 520 and 530, the thickness (T3) of the third stack 530 disposed relatively close to the cathode 600 is relatively larger than the thickness (T2) of the second stack 520 disposed relatively close to the anode 400. Also, the thickness (T2) of the second stack 520 is relatively larger than the thickness (T1) of the first stack 510 disposed relatively close to the anode 400. The thickness (T1) of the first stack 510, the second thickness (T2) of the second stack 520, and the thickness (T3) of the third stack 530 satisfy the following Equation 1.

$$T3 > T2 > T1 \quad \text{[Equation 1]}$$

That is, the thickness (T3) of the third stack 530 is relatively larger than the thickness (T1) of the first stack 510 and the thickness (T2) of the second stack 520, and the thickness (T2) of the second stack 520 is relatively larger than the thickness (T1) of the first stack 510, whereby it is possible to optimize the micro-cavity of the light emitted from each of the first stack 510, the second stack 520 and the third stack 530 between the two electrodes 400 and 600. In other words, as the stack is closer to the cathode 600, its thickness becomes larger in comparison to the thickness of the stack disposed closer to the anode 400. Accordingly, the emission layers 510E, 520E and 530E included in the stacks 510, 520 and 530 may be disposed at the respective positions enabling the optimal micro-cavity between the two electrodes 400 and 600, to thereby improve the light-emission efficiency and color reproduction ratio of the OLED apparatus 1000, and also to lower the color change rate of the OLED apparatus 1000.

According to the first embodiment of the present disclosure, the first emission layer 510E of the first stack 510 includes the light-emitting dopant for emitting blue light or yellow-green light. Assuming that the total thickness of the thickness (T1) of the first stack 510, the thickness (T2) of the second stack 520, and the thickness (T3) of the third stack 530 is 100%, the thickness (T1) of the first stack 510 may be within a range from 10% to 20%, to thereby optimize the micro-cavity of the light emitted from the first stack 510 between the two electrodes 400 and 600. In this case, with respect to the thickness (T1) of the first stack 510, the thickness (T1') from the upper surface of the reflection layer 410 of the anode 400 to the lower surface of the first emission layer 510E may be within a range from 2% to 90%. That is, with respect to the distance (T1) from the upper surface of the reflection layer 410 of the anode 400 and the upper surface of the first N-type charge generation layer 540N, the first emission layer 510E may be disposed at the position corresponding to a range from 2% to 90%, to thereby optimize the micro-cavity of the light emitted from the first emission layer 510E between the two electrodes 400 and 600.

According to the first embodiment of the present disclosure, the second emission layer 520E of the second stack 520 includes the light-emitting dopant for emitting blue light or yellow-green light. Assuming that the total thickness of the thickness (T1) of the first stack 510, the thickness (T2) of the second stack 520, and the thickness (T3) of the third stack 530 is 100%, the thickness (T2) of the second stack 520 may be within a range from 30% to 40%, to thereby optimize the micro-cavity of the light emitted from the second stack 520 between the two electrodes 400 and 600. In this case, with respect to the thickness (T2) of the second stack 520, the thickness (T2') from the upper surface of the first N-type charge generation layer 540N to the lower surface of the second emission layer 520E may be within a range from 2% to 90%. That is, with respect to the distance (T2) from the upper surface of the first N-type charge generation layer 540N to the upper surface of the second N-type charge generation layer 550N, the second emission layer 520E may be disposed at the position corresponding to a range from 2% to 90%, to thereby optimize the micro-cavity of the light emitted from the second emission layer 520E between the two electrodes 400 and 600.

According to the first embodiment of the present disclosure, the third emission layer 530E of the third stack 530 includes the light-emitting dopant for emitting blue light. Assuming that the total thickness of the thickness (T1) of the first stack 510, the thickness (T2) of the second stack 520, and the thickness (T3) of the third stack 530 is 100%, the thickness (T3) of the third stack 530 may be within a range from 45% to 60%, to thereby optimize the micro-cavity of the light emitted from the third stack 530 between the two electrodes 400 and 600. In this case, with respect to the thickness (T3) of the third stack 530, the thickness (T3') from the upper surface of the second N-type charge generation layer 550N to the lower surface of the third emission layer 530E may be within a range from 2% to 90%. In other words, with respect to the distance (T3) from the upper surface of the second N-type charge generation layer 550N to the upper surface of the cathode 600, the third emission layer 530E may be disposed at the position corresponding to a range from 2% to 90%, to thereby optimize the micro-cavity of the light emitted from the third emission layer 530E between the two electrodes 400 and 600.

If the emission layer included in each of the stacks includes the plurality of layers, or the auxiliary emission layer is additionally provided in the stack, the thickness (T1', T2', T3') indicating the position of the emission layer in each stack may be defined with respect to the lowermost-positioned emission layer among the plurality of emission layers. For example, if the first stack 510 includes the first emission layer 510E, and the auxiliary emission layer disposed between the first emission layer 510E and the anode 400, the thickness (T1') from the upper surface of the reflection layer 410 of the anode 400 to the lower surface of the auxiliary emission layer may be within a range from 2% to 90% with respect to the thickness (T1) of the first stack 510.

As explained above, the OLED apparatus 1000 according to the first embodiment of the present disclosure includes the plurality of stacks 510, 520 and 530 between the reflection-anode 400 and the transparent-cathode 600, and the thickness of the stack disposed close to the transparent-cathode 600 is relatively larger than the thickness of the stack disposed close to the reflection-anode 400. A reflection-anode may also be referred to as a reflective-anode. Accordingly, the micro-cavity of the light emitted from each stack 510, 520 and 530 is optimized so that it is possible to improve the light-emission efficiency, the color reproduction ratio, and the color change rate of the OLED apparatus 1000.

Figures 3, 4A:
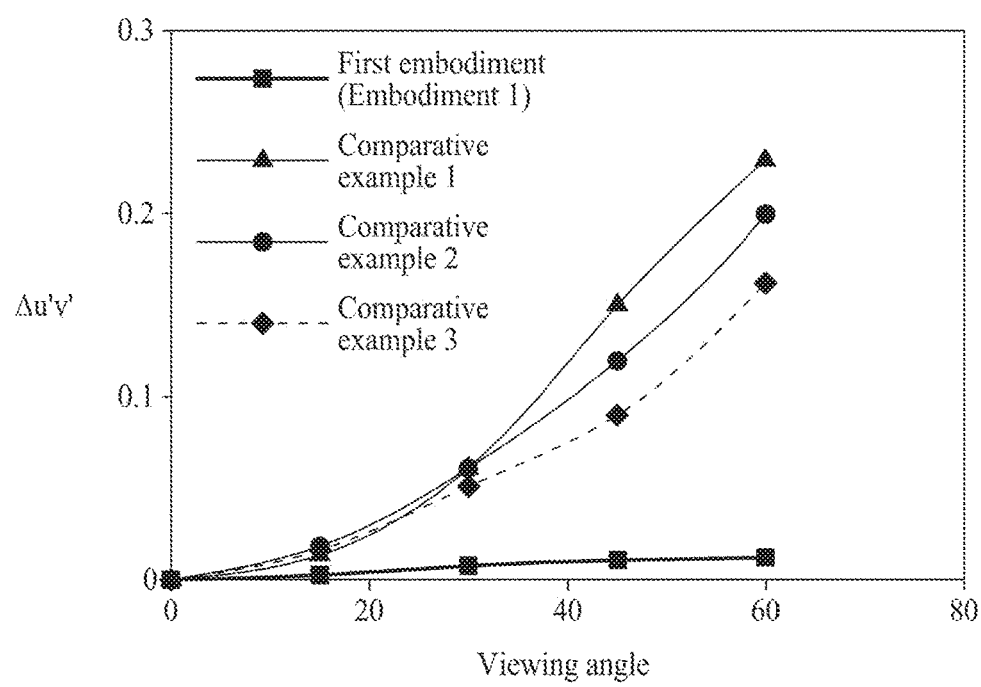
FIG. 3 is a table showing a light-emission efficiency in the OLED apparatus according to the first embodiment of the present disclosure and OLED apparatuses according to comparative examples.
FIG. 4A is a graph showing a color change rate in the OLED apparatus according to the first embodiment of the present disclosure and OLED apparatuses according to comparative examples.
Figure 4B:
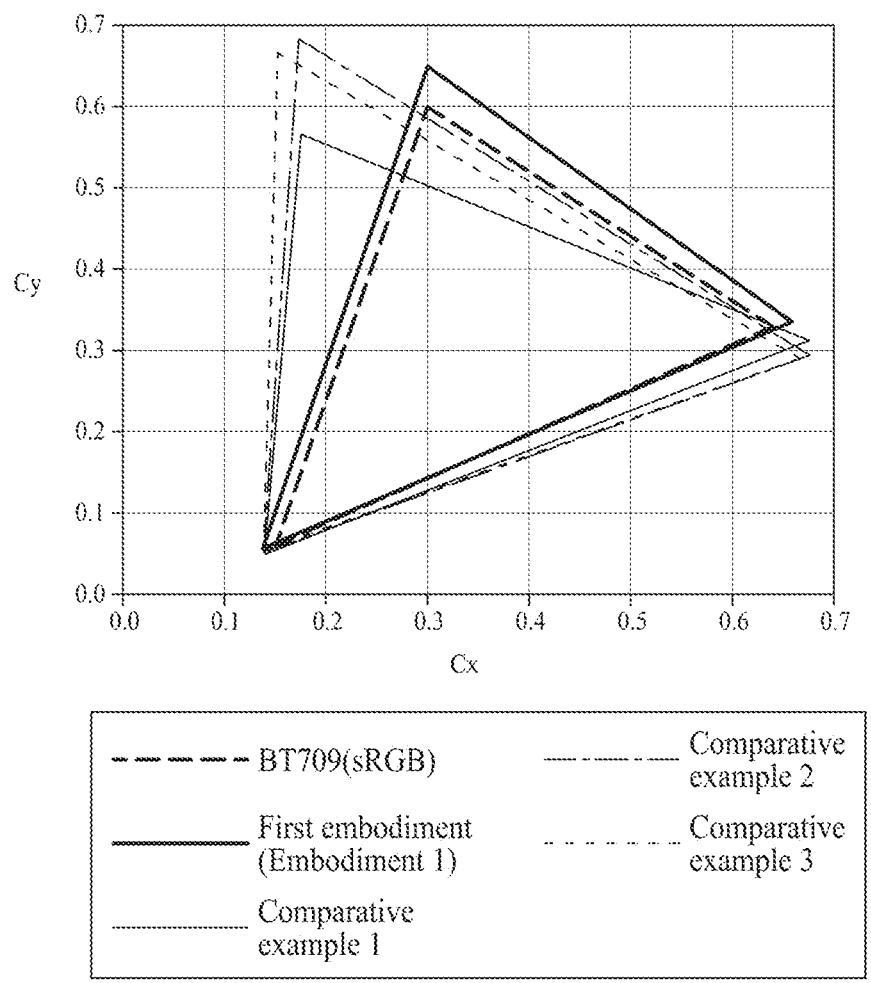
FIG. 4B is a graph showing a color reproduction ratio in the OLED apparatus according to the first embodiment of the present disclosure and OLED apparatuses according to comparative examples.

FIG. 3 is a table showing the light-emission efficiency in the OLED apparatus according to the first embodiment of the present disclosure and OLED apparatuses according to comparative examples. FIG. 4A is a graph showing the color change rate in the OLED apparatus according to the first embodiment of the present disclosure and OLED apparatuses according to comparative examples. FIG. 4B is a graph showing the color reproduction ratio in the OLED apparatus according to the first embodiment of the present disclosure and OLED apparatuses according to comparative examples.

In case of the first embodiment of FIGS. 3, 4A and 4B, among the plurality of stacks, the thickness of the stack disposed close to the transparent-cathode is relatively larger than the thickness of the stack disposed close to the reflection-anode. In detail, in case of the OLED apparatus 1000 described with reference to FIG. 2, among the plurality of stacks, the thickness (T3) of the third stack 530 is larger than the thickness (T1) of the first stack 510 and the thickness (T2) of the second stack 520, and the thickness (T2) of the second stack 520 is larger than the thickness (T1) of the first stack 510 (T1<T2<T3). Also, in case of the first embodiment, assuming that the total thickness (T) of the plurality of stacks 510, 520 and 530 is 100%, a thickness ratio in the plurality of stacks 510, 520 and 530 is at T1:T2:T3=16%:36%:48%.

In case of the comparative example 1 of FIGS. 3, 4A and 4B, assuming that the total thickness (T) of the plurality of stacks 510, 520 and 530 is 100%, a thickness ratio in the plurality of stacks 510, 520 and 530 is at T1:T2:T3=33.3%:33.3%:33.3%.

In case of the comparative example 2 of FIGS. 3, 4A and 4B, among the plurality of stacks, the thickness (T2) of the second stack 520 is the largest one, and the thickness (T1) of the first stack 510 is the same as the thickness (T3) of the third stack 530 (T1=T3<T2). In detail, in case of the comparative example 2, assuming that the total thickness (T) of the plurality of stacks 510, 520 and 530 is 100%, a thickness ratio in the plurality of stacks 510, 520 and 530 is at T1:T2:T3=30%:40%:30%.

In case of the comparative example 3 of FIGS. 3, 4A and 4B, among the plurality of stacks, the thickness (T1) of the first stack 510 is the largest one, and the thickness (T2) of the second stack 520 is the same as the thickness (T3) of the third stack 530 (T1>T2=T3). In detail, in case of the comparative example 3, assuming that the total thickness (T) of the plurality of stacks 510, 520 and 530 is 100%, a thickness ratio in the plurality of stacks 510, 520 and 530 is at T1:T2:T3=40%:30%:30%.

In the first embodiment, and the comparative examples 1, 2 and 3, each of the first stack 510 and the third stack 530 includes at least one organic layer having the light-emitting dopant for emitting blue light, and the second stack 520 includes at least one organic layer having the light-emitting dopant for emitting yellow-green light.

In the first embodiment of the present disclosure, the thickness ratio in the thickness (T1) of the first stack 510, the thickness (T2) of the second stack 520, and the thickness (T3) of the third stack 530 satisfies the condition of T1<T2<T3, whereby it is possible to optimize the micro-cavity of the light emitted from each of the stacks 510, 520 and 530, thereby improving the light-emission efficiency of the OLED apparatus 1000.

In detail, referring to FIG. 3, in comparison to the first embodiment of the present disclosure, the comparative example 1 that the thickness ratio in the thickness (T1) of the first stack 510, the thickness (T2) of the second stack 520, and the thickness (T3) of the third stack 530 satisfies the condition of T1=T2=T3 cannot optimize the micro-cavity of the yellow-green light emitted from the second stack 520, whereby the red (R) light efficiency, green (G) light efficiency, and white (W) light efficiency are largely lowered.

Also, in comparison to the first embodiment of the present disclosure, the comparative example 2 that the thickness ratio in the thickness (T1) of the first stack 510, the thickness (T2) of the second stack 520, and the thickness (T3) of the third stack 530 satisfies the condition of T1=T3<T2 cannot optimize the micro-cavity of the blue light emitted from the stack 510 and the third stack 530, and the micro-cavity of the yellow-green light emitted from the second stack 520, whereby the red (R) light efficiency, green (G) light efficiency, blue (B) light efficiency, and white (W) light efficiency are largely lowered.

Also, in comparison to the first embodiment of the present disclosure, the comparative example 3 that the thickness ratio in the thickness (T1) of the first stack 510, the thickness (T2) of the second stack 520, and the thickness (T3) of the third stack 530 satisfies the condition of T1>T2=T3 cannot optimize the micro-cavity of the yellow-green light emitted from the second stack 520, whereby the red (R) light efficiency, green (G) light efficiency, and white (W) light efficiency are especially lowered.

That is, in comparison to the first embodiment of the present disclosure, the emission layers 510E, 520E and 530E included in each of the plurality of stacks 510, 520 and 530 for the comparative examples 1, 2 and 3 are not disposed at the corresponding positions for optimizing the micro-cavity between the two electrodes 400 and 600, whereby the light-emission efficiency of the OLED apparatus 1000 in each of the comparative examples 1, 2 and 3 is relatively lower than the light-emission efficiency of the OLED apparatus 1000 according to the first embodiment of the present disclosure.

FIG. 4A is a graph showing the color change rate in the OLED apparatus according to the first embodiment of the present disclosure and OLED apparatuses according to comparative examples 1, 2 and 3. When the OLED apparatus is seen from the front, its viewing angle is 0°. In detail, FIG. 4A is the graph obtained by measuring the value of Δu'v' in accordance with the gradually-increased viewing angle from 0° to 60°. According as the change of color in accordance with the viewing angle becomes smaller, the value of Δu'v' becomes smaller.

Referring to FIG. 4A, in case of the comparative example 1, the color change rate is gradually increased within the range of viewing angle from 0° to 60°, and the value of Δu'v' is about 0.230 when the viewing angle is at 60°. In case of the comparative example 2, the color change rate is gradually increased within the range of viewing angle from 0° to 60°, and the value of Δu'v' is about 0.200 when the viewing angle is at 60°. In case of the comparative example 3, the color change rate is gradually increased within the range of viewing angle from 0° to 60°, and the value of Δu'v' is about 0.162 when the viewing angle is at 60°. That is, in case of the comparative examples 1, 2 and 3, the micro-cavity of the light emitted from the plurality of stacks 510, 520 and 530 is not optimized so that the color change is gradually increased by the spectrum change of the emitted light in accordance with the increase of viewing angle. Especially, if the value of Δu'v' is larger than 0.05 within the range of viewing angle from 0° to 60°, a viewer discerns the color difference in accordance with the viewing angle, to thereby lower a picture quality of the OLED apparatus.

Meanwhile, in case of the first embodiment of the present disclosure, the color change rate is barely changed within the range of viewing angle from 0° to 60°, and the value of Δu'v' is about 0.012 when the viewing angle is at 60°. That is, in case of the first embodiment of the present disclosure, the value of Δu'v' is smaller than 0.05 within the range of viewing angle from 0° to 60°, so that it is possible to reduce the color difference in accordance with the viewing angle of the OLED apparatus, and furthermore results in a clear and realistic image. Accordingly, it is possible to provide a display device appropriate for a large-sized television.

FIG. 4B is a graph showing the color reproduction ratio in the OLED apparatus according to the first embodiment of the present disclosure and OLED apparatuses according to comparative examples 1, 2 and 3. In detail, FIG. 4B is the graph for explaining sRGB coverage.

Herein, 'sRGB' is CIE 1976 standard, which indicates the color reproduction ratio including red (R), green (G), and blue (B) colors. Also, a range of the color reproduction ratio may be changed in accordance with a consumer's request or product development, and the color reproduction ratio may be referred to as color gamut, color area, color realization area, color realization range, and etc. Also, 'sRGB coverage' indicates a range of covering entire colors. According as 'sRGB ' coverage increases, it is possible to express more various colors, to thereby improve the color reproduction ratio.

In FIG. 4B, a dotted line indicates 'BT709 ', wherein 'BT709 ' indicates color gamut used for HDTV. In detail, 'Cx' and 'Cy' corresponding to a red color is (0.640, 0.330), 'Cx' and 'Cy' corresponding to a green color is (0.300, 0.600), 'Cx' and 'Cy' corresponding to a blue color is (0.150, 0.060), and a triangle shape is obtained by connecting each corresponding area for the red, green, and blue colors. A method of expressing the color reproduction ratio may be changed to various ways in accordance with a consumer's request or product development, and the content of the present disclosure is not limited to FIG. 4B expressed by 'BT709'.

Referring to FIG. 4B, 'sRGB coverage' of the comparative example 1 is about 93.8%, 'sRGB coverage' of the comparative example 2 is about 98.5%, and 'sRGB coverage' of the comparative example 3 is about 95.8%. Meanwhile, 'sRGB coverage' of the first embodiment of the present disclosure is about 99.0%, that is, 'sRGB coverage' of the first embodiment of the present disclosure is improved in comparison to that of the comparative examples 1, 2, and 3. That is, the first embodiment of the present disclosure has the color gamut which is nearly similar to the area of 'BT709 ' expressed by the dotted line. Accordingly, in comparison to the comparative examples 1, 2, and 3, the first embodiment of the present disclosure may provide a more realistic and clearer image.

As described above, the thickness ratio in the plurality of stacks disposed between the reflection-anode and the transparent-cathode is adjusted so as to obtain the color reproduction ratio of 99% or more than 99% and simultaneously to obtain the Δu'v' value of 0.05 or less than 0.05 within the range of viewing angle from 0° to 60° so that it is possible to improve the light-emission efficiency and the color reproduction ratio of the OLED apparatus, and to lower the color change rate.

Figure 5:
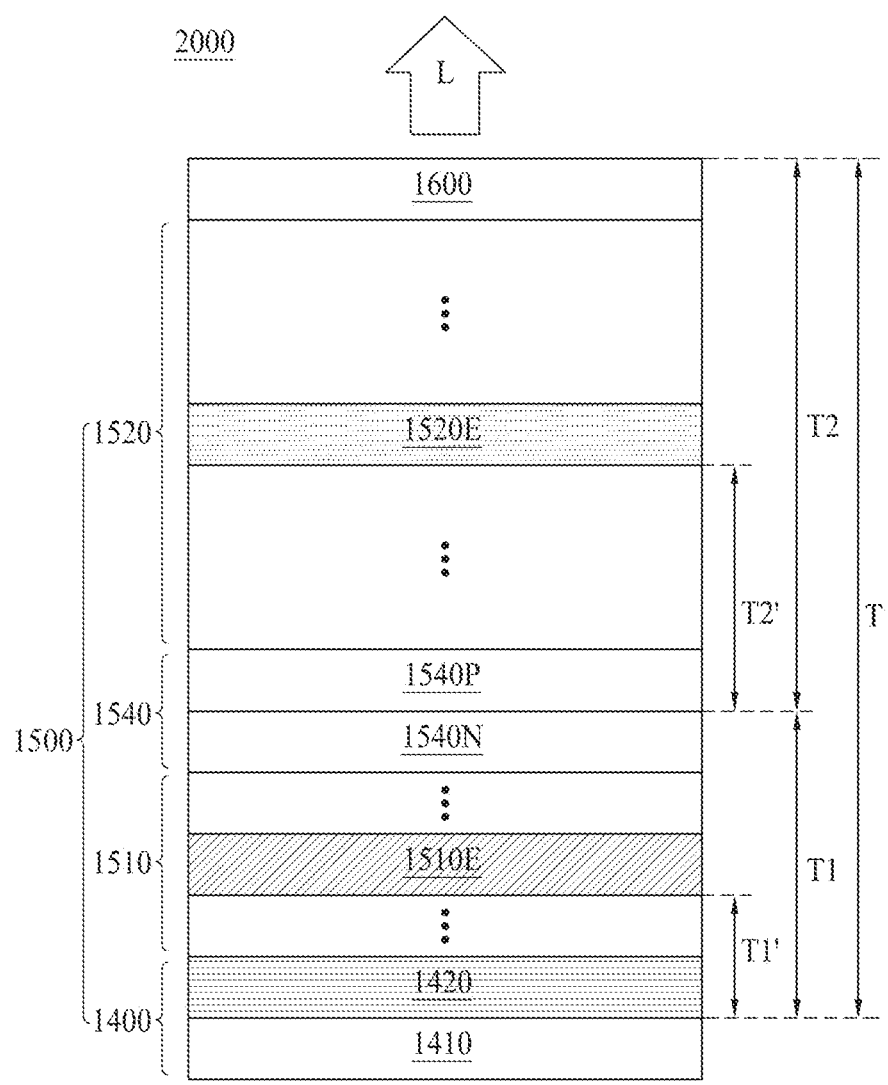
FIG. 5 is a cross sectional view illustrating main components of an OLED apparatus according to the second embodiment of the present disclosure.

FIG. 5 is a cross sectional view illustrating some components of an OLED apparatus 2000 according to the second embodiment of the present disclosure. For convenience of explanation, a detailed description for the same parts or similar parts to those of the first embodiment will be omitted or briefly explained.

The OLED apparatus 2000 according to the second embodiment of the present disclosure, which is shown in FIG. 5, may include an anode 1400 having a reflection properties and including a reflection layer 1410 and a transparent layer 1420, a cathode 1600 having a transparent properties, and a light-emission unit 1500 disposed between the anode 1400 and the cathode 1600. The light-emission unit 1500 may include a first stack 1510, a charge generation layer 1540, and a second stack 1520. Also, the OLED apparatus 2000 according to the second embodiment of the present disclosure is a top emission type, wherein white light (L) is emitted from the light-emission unit 1500, and is emitted through the cathode 1600 having the transparent properties.

The anode 1400 and the cathode 1600 shown in FIG. 5 are the same as the anode 400 and the cathode 600 shown in FIG. 2 according to the first embodiment of the present disclosure, whereby a detailed description for the anode 1400 and the cathode 1600 will be omitted.

The first stack 1510 is disposed on the anode 1400. Between the first and second stacks 1510 and 1520, the first stack 1510 is relatively close to the anode 1400.

The first stack 1510 may include at least one organic layer having light-emitting dopant for emitting blue light. For example, as shown in FIG. 5, the first stack 1510 may include a first emission layer 1510E having light-emitting dopant for emitting blue light.

The first emission layer 1510E may be formed in a single-layered or multi-layered structure including the light-emitting dopant for emitting blue light. In detail, the first emission layer 1510E may include at least one host and at least one light-emitting dopant for emitting blue light. The first emission layer 1510E may include a mixed host having two hosts mixed together, and at least one light-emitting dopant for emitting blue light. The mixed host may include a host having hole transporting properties, and a host having electron transporting properties.

For example, the light-emitting dopant for emitting blue light may be formed of a pyrene-based compound replaced by an arylamine-based compound, but is not limited to this material.

The first stack 1510 may further include at least one among a hole injecting layer (HIL), a hole transporting layer (HTL), an electron transporting layer (ETL), an electron injecting layer (EIL), a hole blocking layer (HBL), an electron blocking layer (EBL), and an auxiliary emission layer.

The auxiliary emission layer of the first stack 1510 may include light-emitting dopant for emitting light whose color is different from that of the light emitted from the first emission layer 1510E. For example, the auxiliary emission layer of the first stack 1510 may include light-emitting dopant for emitting yellow-green light or red light. If the auxiliary emission layer is additionally provided in the first stack 1510, it is possible to improve light-emission efficiency of red or green color.

If the first stack 1510 includes the first emission layer 1510E having the light-emitting dopant for emitting blue light, a peak wavelength of the light emitted from the first stack 1510 may be within a range from 440 nm to 480 nm.

If the first stack 1510 includes the first emission layer 1510E having the light-emitting dopant for emitting blue light, and the auxiliary emission layer having the light-emitting dopant for emitting red light, a peak wavelength of the light emitted from the first stack 1510 may be within a range from 440 nm to 650 nm. And, if the first stack 1510 includes the first emission layer 1510E having the light-emitting dopant for emitting blue light, and the auxiliary emission layer having the light-emitting dopant for emitting yellow-green light, a peak wavelength of the light emitted from the first stack 1510 may be within a range from 440 nm to 580 nm.

As described above, the first stack 1510 further includes at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer, so that it is possible to improve light-emission efficiency or driving voltage properties of the OLED apparatus 2000. According to an embodiment of the OLED apparatus 2000, the additional organic layers may be selectively disposed in the first stack 1510. Also, a thickness (T1) of the first stack 1510 and a position of the first emission layer 1510E in the first stack 1510 may be adjusted based on the position, the thickness, or the number of the additional organic layers included in the first stack 1510.

The charge generation layer 1540 is disposed on the first stack 1510, or disposed between the first stack 1510 and the second stack 1520, to thereby adjust a charge balance between the first stack 1510 and the second stack 1520. The charge generation layer 1540 includes an N-type charge generation layer 1540N and a P-type charge generation layer 1540P. The N-type charge generation layer 1540N and the P-type charge generation layer 1540P are the same as the first N-type charge generation layer 540N and the first P-type charge generation layer 540P described in FIG. 2, or the second N-type charge generation layer 550N and the second P-type charge generation layer 550P described in FIG. 2, whereby a detailed description for the N-type charge generation layer 1540N and the P-type charge generation layer 1540P will be omitted.

The second stack 1520 is disposed on the charge generation layer 1540. In comparison to the first stack 1510, the second stack 1520 is relatively close to the cathode 1600. The second stack 1520 may be disposed between the first stack 1510 and the cathode 1600.

The second stack 1520 may include at least one organic layer having the light-emitting dopant for emitting yellow-green light. For example, as shown in FIG. 5, the second stack 1520 may include the second emission layer 1520E having the light-emitting dopant for emitting yellow-green light.

The second emission layer 1520E may be formed in a single-layered structure or multi-layered structure having the light-emitting dopant for emitting yellow-green light. In detail, the second emission layer 1520E may include at least one host and at least one light-emitting dopant for emitting yellow-green light, or may include a mixed host having two hosts mixed together, and at least one light-emitting dopant for emitting yellow-green light.

The light-emitting dopant for emitting yellow-green light may be formed of an iridium-based compound, but is not limited to this material.

The second stack 1520 may further include at least one among a hole injecting layer (HIL), a hole transporting layer (HTL), an electron transporting layer (ETL), an electron injecting layer (EIL), a hole blocking layer (HBL), an electron blocking layer (EBL), and an auxiliary emission layer.

The auxiliary emission layer of the second stack 1520 may include light-emitting dopant for emitting light whose color is different from that of the light emitted from the second emission layer 1520E. For example, the auxiliary emission layer of the second stack 1520 may include light-emitting dopant for emitting green light or red light. If the auxiliary emission layer is additionally provided in the second stack 1520, it is possible to improve light-emission efficiency of red or green color.

If the second stack 1520 includes the second emission layer 1520E having the light-emitting dopant for emitting yellow-green light, a peak wavelength of the light emitted from the second stack 1520 may be within a range from 540 nm to 580 nm.

If the second stack 1520 includes the second emission layer 1520E having the light-emitting dopant for emitting yellow-green light, and the auxiliary emission layer having the light-emitting dopant for emitting red light, a peak wavelength of the light emitted from the second stack 1520 may be within a range from 540 nm to 650 nm. And, if the second stack 1520 includes the second emission layer 1520E having the light-emitting dopant for emitting yellow-green light, and the auxiliary emission layer having the light-emitting dopant for emitting green light, a peak wavelength of the light emitted from the second stack 1520 may be within a range from 510 nm to 590 nm.

As described above, the second stack 1520 further includes at least one among the hole injecting layer (HIL), the hole transporting layer (HTL), the electron transporting layer (ETL), the electron injecting layer (EIL), the hole blocking layer (HBL), the electron blocking layer (EBL), and the auxiliary emission layer, so that it is possible to improve light-emission efficiency or driving voltage properties of the OLED apparatus 2000. According to an embodiment of the OLED apparatus 2000, the additional organic layers may be selectively disposed in the second stack 1520. Also, a thickness (T2) of the second stack 1520 and a position of the second emission layer 1520E in the second stack 1520 may be adjusted based on the position, the thickness, or the number of the additional organic layers included in the second stack 1520.

In the top emission type OLED apparatus 2000 according to the second embodiment of the present disclosure, the properties of the OLED apparatus 2000, for example, light-emission efficiency, color reproduction ratio or color change rate may be controlled by adjusting the thickness (T1) of the first stack 1510 and the thickness (T2) of the second stack 1520. In more detail, in order to improve the properties of the OLED apparatus 2000, the thickness ratio in the thickness (T1) of the first stack 1510 and the thickness (T2) of the second stack 1520 has to be optimized in consideration of the micro-cavity between the anode 1400 having the reflection properties and the cathode 1600 having the transparent properties.

Referring to FIG. 5, the thickness (T1) of the first stack 1510 indicates the distance from the upper surface of the reflection layer 1410 of the anode 1400 to the interface between the N-type charge generation layer 1540N and the P-type charge generation layer 1540P. In detail, the thickness (T1) of the first stack 1510 may be expressed by the thickness including the thickness of the N-type charge generation layer 1540N and the thickness of the transparent layer 1420 of the anode 1400, as well as the total thickness of the layers included in the first stack 1510.

The thickness (T2) of the second stack 1520 indicates the distance from the interface between the N-type charge generation layer 1540N and the P-type charge generation layer 1540P to the upper surface of the cathode 1600 having the transparent properties. In detail, the thickness (T2) of the second stack 1520 may be expressed by the thickness including the thickness of the P-type charge generation layer 1540P and the thickness of the cathode 1600, as well as the total thickness of the layers included in the second stack 1520.

In the second embodiment of the present disclosure, between the first stack 1510 and the second stack 1520, the thickness (T2) of the second stack 1520 disposed close to the cathode 1600 having the transparent properties is relatively larger than the thickness (T1) of the first stack 1510 disposed close to the anode 1400 having the reflection properties. That is, the thickness (T1) of the first stack 1510 and the thickness (T2) of the second stack 1520 satisfy the following Equation 2.

T2>T1    [Equation 2]

As explained above, the thickness (T2) of the second stack 1520 is larger than the thickness (T1) of the first stack 1510, whereby it is possible to optimize the micro-cavity of the light emitted from each of the first stack 1510 and the second stack 1520 between the two electrodes 1400 and 1600. In other words, the thickness (T2) of the second stack 1520 disposed close to the cathode 1600 is relatively larger than the thickness (T1) of the first stack 1510 disposed close to the anode 1400, the emission layers 1510E and 1520E included in the stacks may be disposed at the respective positions enabling the optimal micro-cavity between the two electrodes 1400 and 1600, to thereby improve the light-emission efficiency and color reproduction ratio of the OLED apparatus 2000, and also to lower the color change rate of the OLED apparatus 2000.

According to the second embodiment of the present disclosure, the first emission layer 1510E of the first stack 1510 includes the light-emitting dopant for emitting blue light. Assuming that the total thickness of the thickness (T1) of the first stack 1510 and the thickness (T2) of the second stack 1520 is 100%, the thickness (T1) of the first stack 510 may be within a range from 15% to 35%, to thereby optimize the micro-cavity of the light emitted from the first stack 1510 between the two electrodes 1400 and 1600. In this case, with respect to the thickness (T1) of the first stack 1510, the thickness (T1') from the upper surface of the reflection layer 1410 of the anode 1400 to the lower surface of the first emission layer 1510E may be within a range from 5% to 90%. That is, with respect to the distance (T1) from the upper surface of the reflection layer 1410 of the anode 1400 to the upper surface of the N-type charge generation layer 1540N, the first emission layer 1510E may be disposed at the position corresponding to a range from 5% to 90%, to thereby optimize the micro-cavity of the light emitted from the first emission layer 1510E between the two electrodes 1400 and 1600.

According to the second embodiment of the present disclosure, the second emission layer 1520E of the second stack 1520 includes the light-emitting dopant for emitting yellow-green light. Assuming that the total thickness of the thickness (T1) of the first stack 1510 and the thickness (T2) of the second stack 1520 is 100%, the thickness (T2) of the second stack 1520 may be within a range from 65% to 85%, to thereby optimize the micro-cavity of the light emitted from the second stack 1520 between the two electrodes 1400 and 1600. In this case, with respect to the thickness (T2) of the second stack 1520, the thickness (T2') from the upper surface of the N-type charge generation layer 1540N to the lower surface of the second emission layer 1520E may be within a range from 5% to 90%. That is, with respect to the distance (T2) from the upper surface of the N-type charge generation layer 1540N to the upper surface of the cathode 1600, the second emission layer 1520E may be disposed at the position corresponding to a range from 5% to 90%, to thereby optimize the micro-cavity of the light emitted from the second emission layer 1520E between the two electrodes 1400 and 1600.

If the emission layer included in each of the stacks includes the plurality of layers, or the auxiliary emission layer is additionally provided in the stack, the thickness (T1', T2') indicating the position of the emission layer in each stack may be defined with respect to the lowermost-positioned emission layer among the plurality of emission layers. For example, if the first stack 1510 includes the first emission layer 1510E, and the auxiliary emission layer disposed between the first emission layer 1510E and the anode 1400, the thickness (T1') from the upper surface of the reflection layer 1410 of the anode 1400 to the lower surface of the auxiliary emission layer may be within a range from 5% to 90% with respect to the thickness (T1) of the first stack 1510.

As explained above, the OLED apparatus 2000 according to the second embodiment of the present disclosure includes the first stack 1510 and the second stack 1520 disposed between the reflection-anode 1400 and the transparent-cathode 1600, wherein the thickness of the second stack 1520 disposed close to the transparent-cathode 1600 is larger than the thickness of the first stack 1510. Accordingly, it is possible to optimize the micro-cavity of the light emitted from the first stack 1510 and the second stack 1520, to thereby improve the light-emission efficiency and the color reproduction ratio, and to reduce the color change rate in the OLED apparatus 2000.

Figures 6, 7A:
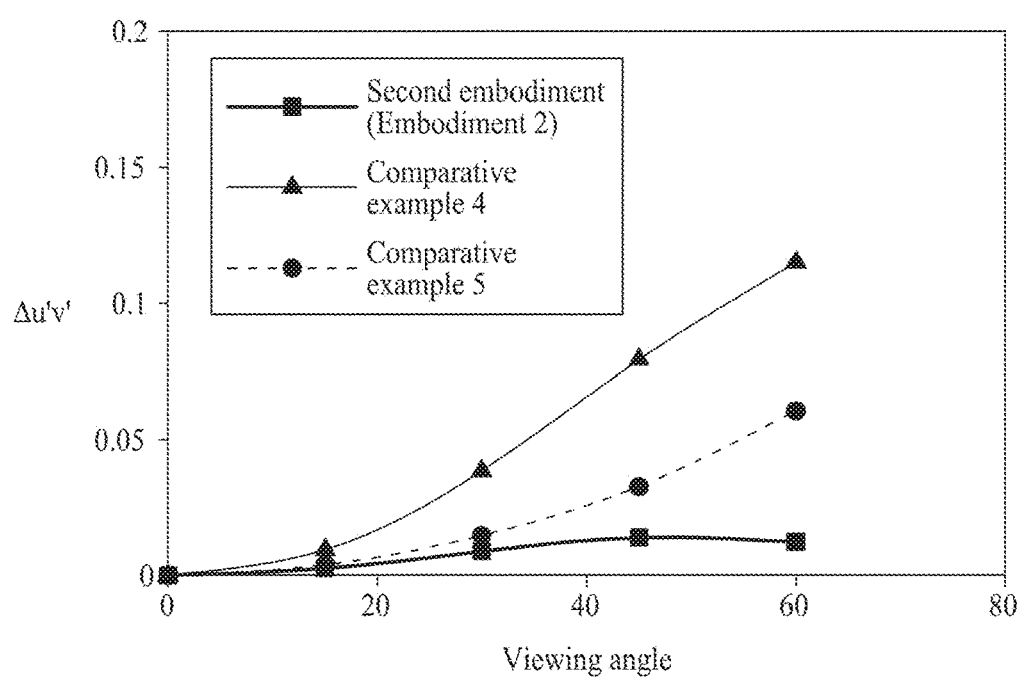
FIG. 6 is a table showing a light-emission efficiency in the OLED apparatus according to the second embodiment of the present disclosure and OLED apparatuses according to comparative examples.
FIG. 7A is a graph showing a color change rate in the OLED apparatus according to the second embodiment of the present disclosure and OLED apparatuses according to comparative examples.
Figure 7B:
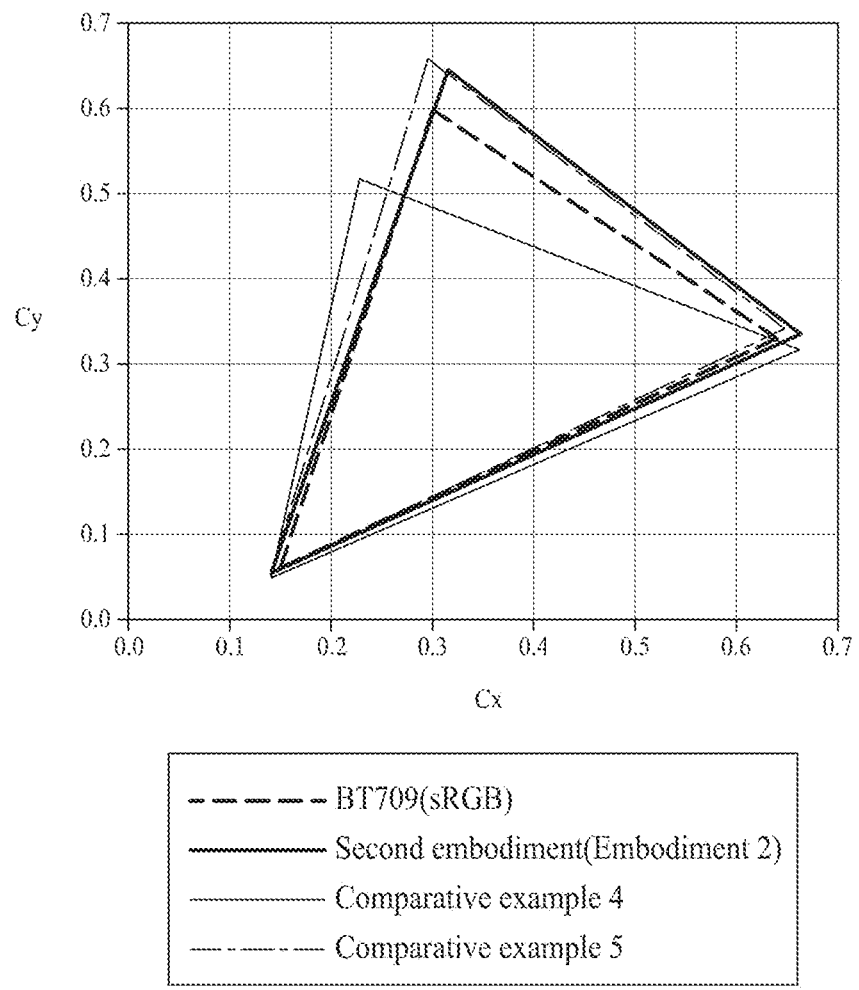
FIG. 7B is a graph showing a color reproduction ratio in the OLED apparatus according to the second embodiment of the present disclosure and OLED apparatuses according to comparative examples.

FIG. 6 is a table showing the light-emission efficiency in the OLED apparatus according to the second embodiment of the present disclosure and OLED apparatuses according to comparative examples. FIG. 7A is a graph showing the color change rate in the OLED apparatus according to the second embodiment of the present disclosure and OLED apparatuses according to comparative examples. FIG. 7B is a graph showing the color reproduction ratio in the OLED apparatus according to the second embodiment of the present disclosure and OLED apparatuses according to comparative examples.

In case of the second embodiment of FIGS. 6, 7A and 7B, the thickness (T2) of the second stack 1520 is larger than the thickness (T1) of the first stack 1510 (T1<T2) in the OLED apparatus 2000 described in FIG. 5. Also, in case of the second embodiment, assuming that the total thickness (T) of the first and second stacks 1510 and 1520 is 100%, a thickness ratio in the first and second stacks 1510 and 1520 is at T1:T2=32%:68%.

In case of the comparative example 4 of FIGS. 6, 7A and 7B, the thickness of the first stack 1510 is the same as the thickness of the second stack 1520 (T1=T2). In detail, in case of the comparative example 4, assuming that the total thickness (T) of the first and second stacks 1510 and 1520 is 100%, a thickness ratio in the first and second stacks 1510 and 1520 is at T1:T2=50%:50%.

In case of the comparative example 5 of FIGS. 6, 7A and 7B, the thickness (T1) of the first stack 1510 is larger than the thickness (T2) of the second stack 1520 (T1>T2). Also, in case of the second embodiment, assuming that the total thickness (T) of the first and second stacks 1510 and 1520 is 100%, a thickness ratio in the first and second stacks 1510 and 1520 is at T1:T2=68%:32%.

In the second embodiment, and the comparative examples 4 and 5, the first stack 1510 includes at least one organic layer having the light-emitting dopant for emitting blue light, and the second stack 1520 includes at least one organic layer having the light-emitting dopant for emitting yellow-green light.

In the second embodiment of the present disclosure, the thickness ratio in the thickness (T1) of the first stack 1510 and the thickness (T2) of the second stack 1520 satisfies the condition of T1<T2, whereby it is possible to optimize the micro-cavity of the light emitted from each of the stacks 1510 and 1520, thereby improving the light-emission efficiency of the OLED apparatus 2000.

In detail, referring to FIG. 6, in comparison to the second embodiment of the present disclosure, the comparative example 4 wherein the thickness ratio in the thickness (T1) of the first stack 1510 and the thickness (T2) of the second stack 1520 satisfies the condition of T1=T2 cannot optimize the micro-cavity of the yellow-green light emitted from the second stack 1520, whereby the red (R) light efficiency, green (G) light efficiency, and white (W) light efficiency are largely lowered.

Also, in comparison to the second embodiment of the present disclosure, the comparative example 5 wherein the thickness ratio in the thickness (T1) of the first stack 1510 and the thickness (T2) of the second stack 1520 satisfies the condition of T1>T2 cannot optimize the micro-cavity of the yellow-green light emitted from the second stack 1520, whereby the red (R) light efficiency, green (G) light efficiency, and white (W) light efficiency are largely lowered.

That is, in comparison to the second embodiment of the present disclosure, the first emission layer 1510E included in the first stack 1510, and the second emission layer 1520E included in the second stack 1520 for the comparative examples 4 and 5 are not disposed at the corresponding positions for optimizing the micro-cavity between the two electrodes 1400 and 1600, whereby the light-emission efficiency of the OLED apparatus 2000 in each of the comparative examples 4 and 5 is relatively lower than the light-emission efficiency of the OLED apparatus 2000 according to the second embodiment of the present disclosure.

FIG. 7A is a graph showing the color change rate in the OLED apparatus according to the second embodiment of the present disclosure and OLED apparatuses according to comparative examples 4 and 5.

Referring to FIG. 7A, in case of the comparative example 4, the color change rate is gradually increased within the range of viewing angle from 0° to 60°, and the value of Δu'v' is about 0.115 when the viewing angle is at 60°. In case of the comparative example 5, the color viewing angle is gradually increased within the range of viewing angle from 0° to 60°, and the value of Δu'v' is about 0.061 when the viewing angle is at 60°. That is, in case of the comparative examples 4 and 5, the micro-cavity of the light emitted from the first stack 1510 and the second stack 1520 is not optimized so that the color change is gradually increased by the spectrum change of the emitted light in accordance with the increase of viewing angle. As described above, if the value of Δu'v' is larger than 0.05 within the range of viewing angle from 0° to 60°, a viewer discerns the color difference in accordance with the viewing angle, to thereby lower a picture quality of the OLED apparatus.

Meanwhile, in case of the second embodiment of the present disclosure, the color change rate is barely changed within the range of viewing angle from 0° to 60°, and the value of Δu'v' is about 0.012 when the viewing angle is at 60°. That is, in case of the second embodiment of the present disclosure, the value of Δu'v' is smaller than 0.05 within the range of viewing angle from 0° to 60°, so that it is possible to reduce the color difference in accordance with the viewing angle of the OLED apparatus, and furthermore to express a clear and realistic image. Accordingly, it is possible to provide a display device appropriate for a large-sized television.

FIG. 7B is a graph showing the color reproduction ratio in the OLED apparatus according to the second embodiment of the present disclosure and OLED apparatuses according to comparative examples 4 and 5. In detail, FIG. 7B is the graph for explaining sRGB coverage.

Referring to FIG. 7B, 'sRGB coverage' of the comparative example 4 is about 92%, and 'sRGB coverage' of the comparative example 5 is about 98%. Meanwhile, 'sRGB coverage' of the second embodiment of the present disclosure is about 100%, that is, 'sRGB coverage' of the second embodiment of the present disclosure is improved in comparison to that of the comparative examples 4 and 5. That is, the second embodiment of the present disclosure has the color gamut which is nearly similar to the area of 'BT709' expressed by the dotted line, whereby the second embodiment of the present disclosure may provide more realistic and clearer image.

As described above, the thickness ratio in the first stack and the second stack disposed between the reflection-anode and the transparent-cathode is adjusted so as to obtain the color reproduction ratio of 99% or more than 99% and simultaneously to obtain the Δu'v' value of 0.05 or less than 0.05 within the range of a viewing angle from 0° to 60° so that it is possible to improve the light-emission efficiency and the color reproduction ratio of the OLED apparatus, and to reduce the color change rate of the OLED apparatus.

In the OLED apparatus according to the embodiment of the present disclosure, the thickness ratio in the plurality of stacks disposed between the reflection-anode and the transparent-cathode is optimized so that it is possible to improve the light-emission efficiency and the color reproduction ratio, and to reduce the color change rate.

According to the embodiment of the present disclosure, among the plurality of stacks, the thickness of the stack disposed close to the cathode is relatively larger than the thickness of the stack disposed close to the anode, so that it is possible to improve the light-emission efficiency, to improve the color reproduction ratio for 'sRGB', and to reduce the color change rate of the light emitted via the cathode from the plurality of stacks.

It will be apparent to those skilled in the art that various modifications and variations can be made in the present disclosure without departing from the scope of the inventions. Thus, it is intended that the present disclosure covers the modifications and variations of this disclosure provided they come within the scope of the appended claims and their equivalents.

What is claimed is:

1. An organic light emitting display (OLED) apparatus comprising:
   a reflection-anode;
   a transparent layer directly on the reflection-anode;
   a first stack directly on the transparent layer, wherein the first stack includes an electron transport layer and at least one organic layer having light-emitting dopant of an arylamine-based compound for emitting blue light;
   a first charge generation layer on the first stack, wherein the first charge generation layer includes a first N-type charge generation layer doped with alkali-based metal, and a first P-type charge generation layer;
   a second stack on the first charge generation layer, wherein the second stack includes at least one organic layer having light-emitting dopant of an iridium-based compound for yellow-green light;
   a second charge generation layer on the second stack, wherein the second charge generation layer includes a second N-type charge generation layer doped with alkali-based metal, and a second P-type charge generation layer;
   a third stack on the second charge generation layer, wherein the third stack includes at least one organic layer having light-emitting dopant of the arylamine-based compound for emitting blue light; and
   a transparent-cathode on the third stack;
   wherein, T1 indicates a distance from a lower surface of the transparent layer to an interface between the first N-type charge generation layer and the first P-type charge generation layer, T2 indicates a distance from the interface between the first N-type charge generation layer and the first P-type charge generation layer to an interface between the second N-type charge generation layer and the second P-type charge generation layer, and T3 indicates a distance from the interface between the second N-type charge generation layer and the second P-type charge generation layer to an upper surface of the transparent-cathode, the T1, T2 and T3 satisfy a thickness ratio of T1:T2:T3 =16%:36%:48%,
   wherein the light emitting device has a color reproduction ratio of 99% or more than 99%, and a color change value ($\Delta u'v'$) of 0.05 or less than 0.05 within a viewing angle range from 0° to 60°.

2. The OLED apparatus according to claim 1, wherein a peak wavelength of light emitted from the first stack is within a range from 440 nm to 480 nm, a peak wavelength of light emitted from the second stack is within a range from 540 nm to 580 nm, and a a peak wavelength of light emitted from the third stack is within a range from 440 nm to 480 nm.

3. The OLED apparatus according to claim 1, wherein at least one among the first stack, the second stack and the third stack includes an auxiliary emission layer, and the auxiliary emission layer includes a light-emitting dopant for emitting light.

4. The OLED apparatus according to claim 1, wherein at least one of among the first stack, the second stack and the third stack includes at least one among a hole injecting layer (HIL), a hole transporting layer (HTL), an electron transporting layer (ETL), an electron injecting layer (EIL), a hole blocking layer (HBL), an electron blocking layer (EBL).

5. The OLED apparatus according to claim 1, wherein light emitted from at least one among the first stack, the second stack and the third stack passes through the transparent-cathode.

* * * * *